US012433073B2

(12) United States Patent
Kim et al.

(10) Patent No.: US 12,433,073 B2
(45) Date of Patent: Sep. 30, 2025

(54) COLOR CONVERSION SUBSTRATE AND DISPLAY DEVICE

(71) Applicant: Samsung Display Co., LTD., Yongin-si (KR)

(72) Inventors: Jong-Hoon Kim, Seoul (KR); Jang-Il Kim, Anyang-si (KR); Jeongki Kim, Hwaseong-si (KR); Keunchan Oh, Hwaseong-si (KR); Kang Soo Han, Seoul (KR); Tae Hyung Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 597 days.

(21) Appl. No.: 17/736,578

(22) Filed: May 4, 2022

(65) Prior Publication Data

US 2022/0359798 A1   Nov. 10, 2022

(30) Foreign Application Priority Data

May 7, 2021   (KR) .......................... 10-2021-0059233

(51) Int. Cl.
*H10H 20/851*   (2025.01)
*H10H 29/14*   (2025.01)

(52) U.S. Cl.
CPC ...... *H10H 20/8514* (2025.01); *H10H 29/142* (2025.01)

(58) Field of Classification Search
CPC ....... H01L 25/16; H01L 25/167; H01L 33/58; H01L 33/60; H01L 2933/0058;
(Continued)

(56) References Cited

U.S. PATENT DOCUMENTS 12,075,678 B2 *   8/2024   Liu ...................... H10K 59/352
2004/0252088 A1 *   12/2004   Kawachi .............. H10K 50/865
                                                                   345/76
(Continued)

FOREIGN PATENT DOCUMENTS

CN        111736388 A       10/2020
JP        2006-0072176 A    3/2006
(Continued)

OTHER PUBLICATIONS

EPO Extended European Search Report dated Sep. 21, 2022, issued in corresponding European Patent Application No. 22171730.9 (8 pages).

*Primary Examiner* — Julio J Maldonado
*Assistant Examiner* — Paul A Berry
(74) *Attorney, Agent, or Firm* — Womble Bond Dickinson (US) LLP

(57) ABSTRACT

A color conversion substrate includes: a bank having a first open region and a second open region; a color conversion layer in the first opening region, the color conversion layer including color conversion particles; a first partition wall partitioning the second opening region into a central region and a peripheral region surrounding the central region, the first partition wall having a polygonal shape with n vertices in a plan view where n is a natural number greater than or equal to 3; and n second partition walls extending from the n vertices of the first partition wall to an edge of the second opening region, respectively, to partition the peripheral region into n sub-regions.

22 Claims, 20 Drawing Sheets

(58) Field of Classification Search
CPC ......... H01L 27/14605; H01L 27/14607; H01L 27/14603; H01L 33/505; H01L 27/322; H01L 27/156; H01L 51/50; H01L 33/50; H01L 33/00; G02B 5/23; G02B 5/201; H10K 77/10; H10K 50/865; H10K 59/8792; H10K 59/38; H10K 59/877; H10K 2102/331; H10K 59/121; H10K 59/122; H10K 59/18; H10K 59/19; H10K 59/353; H10K 59/80; H10K 59/40; H10K 65/00; H10K 59/88; Y02P 70/50; Y02E 10/549; G02F 1/133514; G02F 1/13357; G02F 1/1335; G02F 1/1333; H05B 33/12; H05B 33/22; H05B 33/02; H05B 33/14; G09F 9/00; H10H 20/8506; H10H 20/882; G06F 1/18–189

See application file for complete search history.

(56) References Cited

U.S. PATENT DOCUMENTS

| | | | | |
|---|---|---|---|---|
| 2012/0097991 | A1* | 4/2012 | Ikeda | H10K 50/81 257/E33.073 |
| 2015/0084144 | A1* | 3/2015 | Suzuki | H10F 39/8053 438/70 |
| 2020/0110303 | A1 | 4/2020 | Lee et al. | |

FOREIGN PATENT DOCUMENTS

| | | | | | |
|---|---|---|---|---|---|
| JP | 2013109907 | A | * | 6/2013 | |
| JP | 2013254093 | A | * | 12/2013 | .............. H01J 29/30 |
| KR | 10-2021-0000184 | A | | 1/2021 | |

* cited by examiner

COLOR CONVERSION SUBSTRATE AND DISPLAY DEVICE

CROSS-REFERENCE TO RELATED APPLICATION

This application claims priority to and the benefit of Korean Patent Application No. 10-2021-0059233 filed on May 7, 2021 in the Korean Intellectual Property Office (KIPO), the entire content of which is incorporated by reference herein.

BACKGROUND

1. Field

The present disclosure relates to a display device. More particularly, the present disclosure relates to a display device including a color conversion substrate.

2. Description of the Related Art

A display device may include a color conversion substrate and an array substrate overlapping the color conversion substrate. The color conversion substrate may include a bank including a first opening region and a color conversion layer disposed in the first opening region. The array substrate may include a light emitting element. The light emitting element may overlap the color conversion layer, and light emitted from the light emitting element may pass through the color conversion layer to have a specific color. The color conversion layer may be formed by an inkjet scheme.

The above information disclosed in this Background section is for enhancement of understanding of the background of the present disclosure, and therefore, it may contain information that does not constitute prior art

SUMMARY

Aspects of one or more embodiments of the present disclosure are directed toward a color conversion substrate capable of reducing a size of protrusion caused by erroneous jetting of an ink, and/or preventing the protrusion from being generated.

Aspects of one or more embodiments of the present disclosure are directed toward a display device capable of reducing damage to an array substrate caused by the protrusion.

However, aspects and features of the present disclosure are not limited to the above-described aspects and features, and may be variously expanded in a suitable manner without departing from the spirit and scope of the present disclosure.

According to one or more embodiments of the present disclosure, a color conversion substrate includes: a bank having a first open region and a second open region; a color conversion layer in the first opening region, the color conversion layer including color conversion particles; a first partition wall partitioning the second opening region into a central region and a peripheral region surrounding the central region, the first partition wall having a polygonal shape with n vertices in a plan view where n is a natural number greater than or equal to 3; and n second partition walls extending from the n vertices of the first partition wall to an edge of the second opening region, respectively, to partition the peripheral region into n sub-regions.

According to one or more embodiments, each of the n second partition walls may be perpendicular to the edge of the second opening region.

According to one or more embodiments, a first thickness of the first partition wall may be different from a second thickness of each of the n second partition walls.

According to one or more embodiments, a first thickness of the first partition wall may be 5 μm or more and 25 μm or less. A second thickness of each of the n second partition walls may be 5 μm or more and 25 μm or less.

According to one or more embodiments, an area of each of the n sub-regions may be smaller than an area of the central region.

According to one or more embodiments, an angle between a second partition wall of the n second partition walls and the first partition wall contacting (i.e., making contact with) the second partition wall may be greater than or equal to 90 degrees.

According to one or more embodiments, the color conversion substrate may further include a light blocking layer overlapping the second opening region.

According to one or more embodiments, the first partition wall may have an octagonal shape including a first side, a second side contacting the first side, a third side contacting the second side, a fourth side contacting the third side, a fifth side contacting the fourth side, a sixth side contacting the fifth side, a seventh side contacting the sixth side, and an eighth side contacting the first side and the seventh side in a plan view. The n second partition walls may include a first compartmental wall contacting the first side and the second side, a second compartmental wall contacting the second side and the third side, a third compartmental wall contacting the third side and the fourth side, a fourth compartmental wall contacting the fourth side and the fifth side, a fifth compartmental wall contacting the fifth side and the sixth side, a sixth compartmental wall contacting the sixth side and the seventh side, a seventh compartmental wall contacting the seventh side and the eighth side, and an eighth compartmental wall contacting the eighth side and the first side.

According to one or more embodiments, the first side and the fifth side may extend in a first direction. The third side and the seventh side may extend in a second direction that is perpendicular to the first direction.

According to one or more embodiments, each of the first compartmental wall and the eighth compartmental wall may be perpendicular to the first side. Each of the second compartmental wall and the third compartmental wall may be perpendicular to the third side. Each of the fourth compartmental wall and the fifth compartmental wall may be perpendicular to the fifth side. Each of the sixth compartmental wall and the seventh compartmental wall may be perpendicular to the seventh side.

According to one or more embodiments, each of the first to eighth compartmental walls may have a first length. Each of the first side, the third side, the fifth side, and the seventh side may have a second length that is different from the first length. Each of the second side, the fourth side, the sixth side, and the eighth side may have a third length that is different from the first length and the second length.

According to one or more embodiments, the first length may be smaller (e.g., shorter) than the second length. The first length may be smaller (e.g., shorter) than the third length.

According to one or more embodiments, the first partition wall may include a first side, a second side contacting the first side, a third side contacting the second side, a fourth side contacting the third side, a fifth side contacting the fourth side, and a sixth side contacting the fifth side and the first side. The n second partition walls may include a first compartmental wall contacting the first side and the second side, a second compartmental wall contacting the second side and the third side, a third compartmental wall contacting the third side and the fourth side, a fourth compartmental wall contacting the fourth side and the fifth side, a fifth compartmental wall contacting the fifth side and the sixth side, and a sixth compartmental wall contacting the sixth side and the first side.

According to one or more embodiments, the first side and the fourth side may be parallel to each other. The second side and the fifth side may be parallel to each other. The third side and the sixth side may be parallel to each other.

According to one or more embodiments, each of the first compartmental wall and the sixth compartmental wall may be perpendicular to the first side. Each of the third compartmental wall and the fourth compartmental wall may be perpendicular to the fourth side.

According to one or more embodiments of the present disclosure, a display device includes: a color conversion substrate including a bank having a first open region and a second open region; a color conversion layer in the first opening region, the color conversion layer including color conversion particles; a first partition wall partitioning the second opening region into a central region and a peripheral region surrounding the central region, the first partition wall having a polygonal shape with n vertices in a plan view where n is a natural number greater than or equal to 3; and n second partition walls extending from the n vertices of the first partition wall to an edge of the second opening region, respectively, to partition the peripheral region into n sub-regions; and an array substrate overlapping the color conversion substrate, the array substrate including a light emitting element overlapping the first opening region.

According to one or more embodiments, the array substrate may include: a first light emitting element row including a first light emitting element and a second light emitting element, the first light emitting element and the second light emitting element being alternately arranged in a first direction; and a second light emitting element row including third light emitting elements arranged in the first direction, the second light emitting element row being spaced from the first light emitting element row in a second direction that is perpendicular to the first direction. The first light emitting element row and the second light emitting element row may be alternately arranged in the second direction.

According to one or more embodiments, the first opening region may include: a first color conversion region overlapping the first light emitting element; a second color conversion region overlapping the second light emitting element; and a third color conversion region overlapping the third light emitting element. The color conversion substrate may include: a first color conversion row including the first color conversion region and the second color conversion region, the first color conversion region and the second color conversion region being alternately arranged in the first direction; and a second color conversion row including the third color conversion region and the second opening region, the third color conversion region and the second opening region being alternately arranged in the first direction. The first color conversion row and the second color conversion row may be alternately arranged in the second direction.

According to one or more embodiments, each of the first color conversion region, the second color conversion region, and the third color conversion region may have a rectangular shape having a first area in a plan view. The second opening region may have a rectangular shape having a second area that is larger than the first area in a plan view.

According to one or more embodiments, the color conversion substrate may further include: a third opening region located between the first color conversion region and the second color conversion region, the first color conversion region and the second color conversion region being adjacent to each other; and a fourth opening region located between the third color conversion region and the first color conversion row.

According to one or more embodiments, a width of the third opening region in the first direction may be smaller than a width of the first color conversion region in the first direction.

According to one or more embodiments, a width of the fourth opening region in the second direction may be smaller than a width of the third color conversion region in the second direction.

According to a color conversion substrate of one or more embodiments of the present disclosure, the first partition wall may have a polygonal shape including n vertices in a plan view where n is a natural number greater than or equal to 3, and the second partition wall may extend from the n vertices to an edge of the second opening region, respectively. Accordingly, an area of a region where the first partition wall and the second partition wall make contact with each other in the second opening region can be relatively reduced, and when an ink is erroneously jetted in the region where the first partition wall and the second partition wall make contact with each other, a protrusion having a relatively small size can be formed, or substantially no protrusion may be formed.

According to one or more embodiments of the present disclosure, the display device may include the color conversion substrate and the array substrate. On the color conversion substrate, a protrusion formed by an ink that is erroneously jetted in a region where the first partition wall and the second partition wall make contact with each other can have a relatively small size, or substantially no protrusion may be formed. Accordingly, the array substrate may not be damaged by the protrusion.

However, effects of the present disclosure are not limited to the above-described effects, and may be variously expanded without departing from the spirit and scope of the present disclosure.

DETAILED DESCRIPTION

Figure 1:
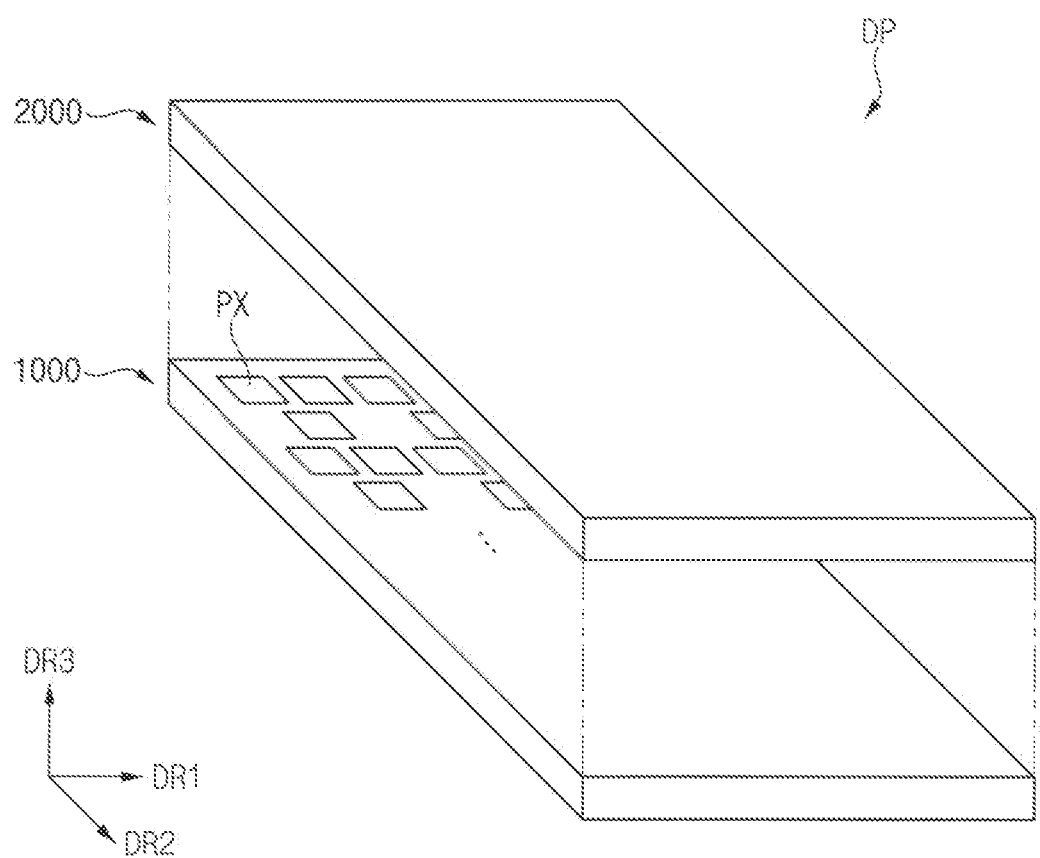
FIG. 1 is a perspective view showing a display device according to one or more embodiments of the present disclosure.

Hereinafter, a color conversion substrate and a display device according to embodiments of the present disclosure will be described in more detail with reference to the accompanying drawings. The same or similar reference numerals will be used for the same elements in the accompanying drawings, and duplicative descriptions thereof may not be provided.

The terminology used herein is for the purpose of describing particular embodiments only and is not intended to limit the embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present.

When an element is referred to as being "directly on," "directly connected to," or "directly coupled to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

In one or more embodiments, in the case where a display device includes an array substrate and a color conversion substrate including a bank having a first opening region and a color conversion layer disposed in the first opening region, the bank may further include a second opening region for receiving an erroneously jetted ink. In this case, a plurality of partition walls may be disposed in the second opening region.

However, in the second opening region, when an ink is erroneously jetted on an intersecting region where the partition walls intersect each other, an undesirable protrusion may be formed. Accordingly, when the color conversion substrate and the array substrate are coupled to each other, the array substrate may be damaged by the protrusion, so that display performance of the display device may be degraded.

Therefore, aspects of one or more embodiments of the present disclosure are directed toward a color conversion substrate capable of reducing a size of the protrusion caused by erroneous jetting of an ink, and/or preventing the protrusion from being generated.

FIG. 1 is a perspective view showing a display device according to one or more embodiments of the present disclosure.

Referring to FIG. 1, a display device DP may include an array substrate 1000 and a color conversion substrate 2000.

The array substrate 1000 may include a light emitting element PX. The light emitting element PX may receive an electrical signal to emit light having a luminance corresponding to a level of the electrical signal.

The color conversion substrate 2000 may be disposed on the array substrate 1000. The light emitted from the light emitting element PX may pass through the color conversion substrate 2000. The color conversion substrate 2000 may convert a color of the light emitted from the light emitting element PX. For example, the light emitted from the light emitting element PX that is incident on the color conversion substrate 2000 may be converted into red light while passing through the color conversion substrate 2000. As another example, the light emitted from the light emitting element PX may be converted into green light while passing through the color conversion substrate 2000. The light passing through the color conversion substrate 2000 may be visually recognized by a user and may be used by the display device DP to form or display an image.

Figure 2:
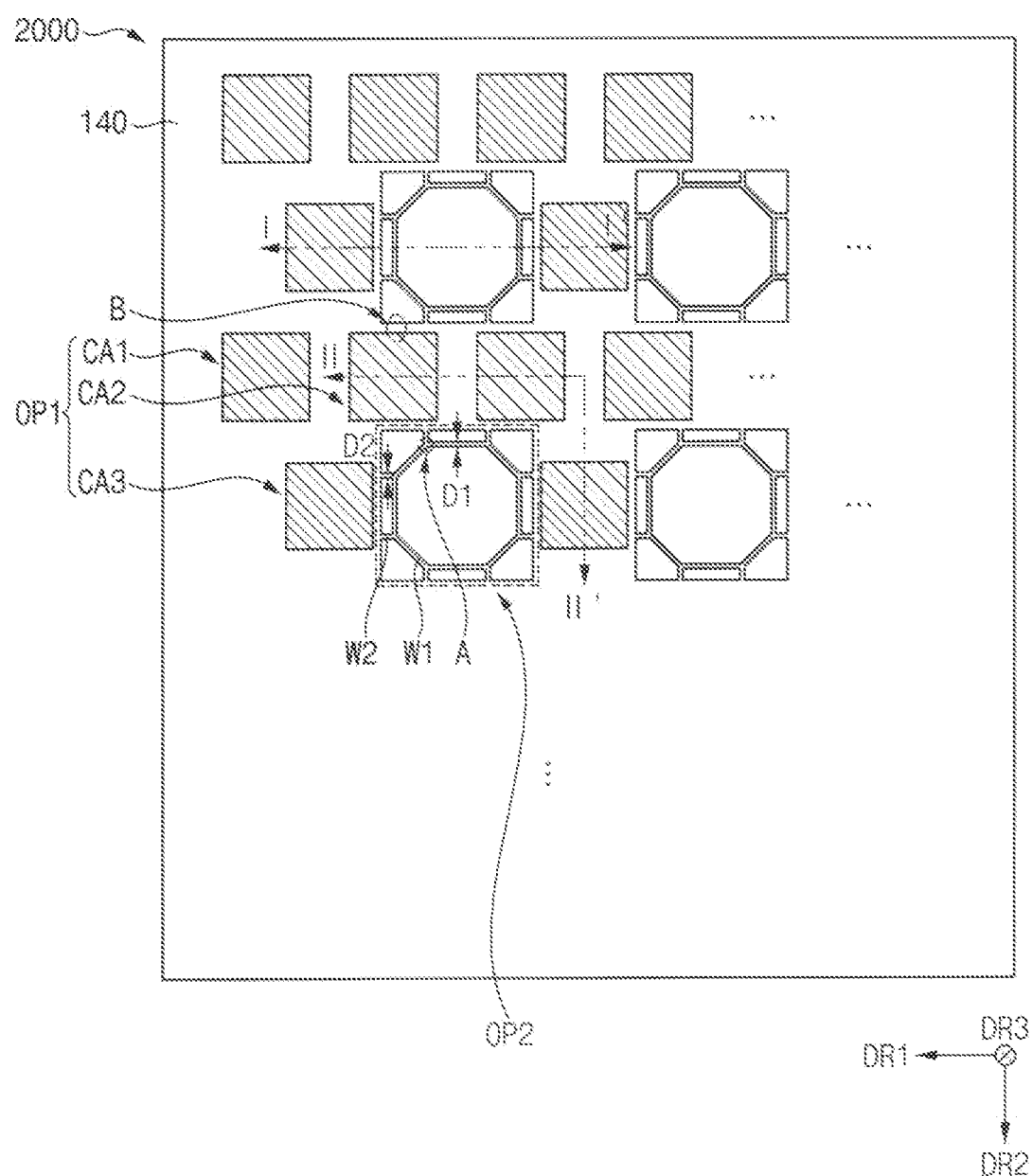
FIGS. 2 to 4 are views showing a color conversion substrate included in the display device of FIG. 1.
Figure 3:
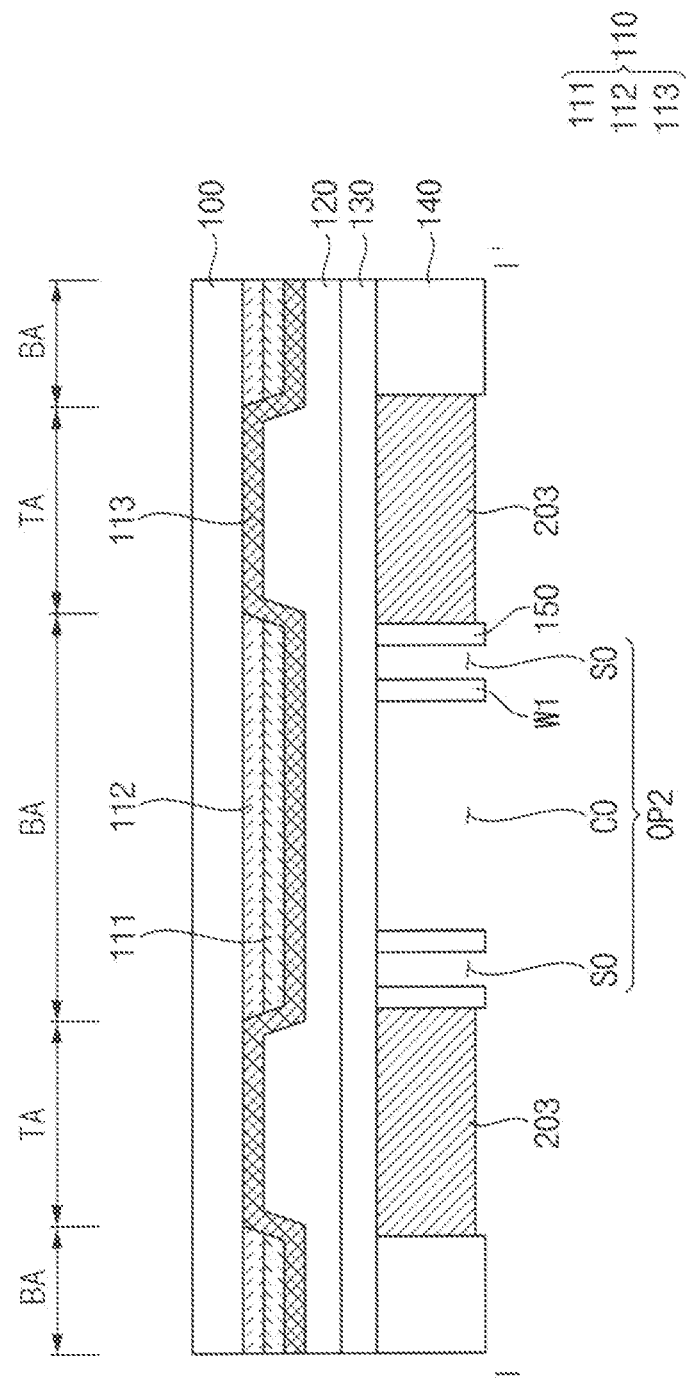
Figure 4:
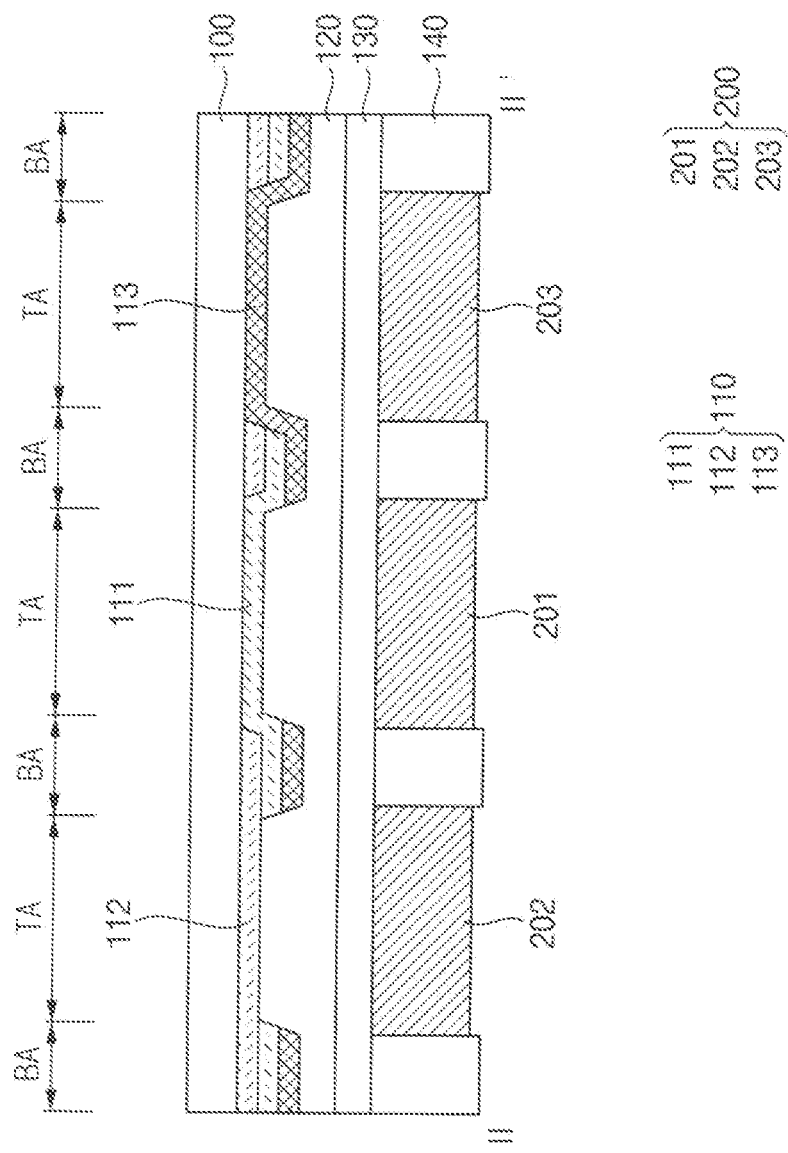

FIGS. 2 to 4 are views showing a color conversion substrate included in the display device of FIG. 1. FIG. 2 may be a plan view showing a color conversion substrate 2000 of FIG. 1 when viewed in a third direction DR3, FIG. 3 may be a sectional view taken along the line of FIG. 2, and FIG. 4 may be a sectional view taken along the line of FIG. 2.

Referring to FIGS. 2 to 4, the color conversion substrate 2000 may include an upper substrate 100, a color filter layer 110, a low refraction layer 120, a protective layer 130, a color conversion layer 200, and a bank 140.

The upper substrate 100 may transmit the light emitted from the light emitting element PX. For example, the upper substrate 100 may be a transparent substrate. The upper substrate 100 may include an insulating material such as glass or plastic. Alternatively, the upper substrate 100 may include an organic polymer material such as polycarbonate (PC), polyethylene terephthalate (PET), polyethylene (PE), or polypropylene (PP).

The color filter layer 110 may be disposed on or under the upper substrate 100. The color filter layer 110 may selectively transmit light having a specific wavelength. For example, the color filter layer 110 may include first to third color filter layers 111, 112, and 113. The first color filter layer 111 may selectively transmit first light having a first wavelength, the second color filter layer 112 may selectively transmit second light having a second wavelength, and the third color filter layer 113 may selectively transmit third light having a third wavelength. In one or more embodiments, the first to third color filter layers 111, 112, and 113 may selectively transmit first to third light having different wavelengths from each other.

A light blocking layer may be disposed on or under the upper substrate 100. The light emitted from the light emitting element PX may pass through only a partial region of the color conversion substrate 2000. The partial region may be defined by the light blocking layer. For example, the light blocking layer may be disposed on a bottom surface of the upper substrate 100 to form a light blocking region BA through which the light emitted from the light emitting element PX does not pass. In this case, a region where the light blocking layer is not disposed on the bottom surface of the upper substrate 100 may be a transmissive region TA through which the light emitted from the light emitting element PX is transmitted.

According to one or more embodiments, the light blocking layer may be formed by stacking the first to third color filter layers 111, 112, and 113 such that the first to third color filter layers 111, 112, and 113 may overlap each other. For example, the first to third color filter layers 111, 112, and 113 may be stacked on the bottom surface of the upper substrate 100 such that the first to third color filter layers 111, 112, and 113 may overlap each other (e.g., overlap each other in a thickness direction of the upper substrate 100), so that the light blocking region BA through which the light emitted from the light emitting element PX does not pass may be formed.

According to one or more embodiments, the light blocking layer may include a light blocking material. The light blocking material may have a specific color.

The low refraction layer 120 may be disposed on or under the color filter layer 110. The low refraction layer 120 may cover the color filter layer 110. The low refraction layer 120 may have a relatively low refractive index. For example, a refractive index of the low refraction layer 120 may be lower than a refractive index of the color conversion layer 200. The low refraction layer 120 may include an organic material. For example, the low refraction layer 120 may include an organic polymer material including silicon (Si).

The protective layer 130 may be disposed on or under the low refraction layer 120. The protective layer 130 may cover the low refraction layer 120. The protective layer 130 may block external impurities to prevent or substantially prevent the color filter layer 110 from being contaminated. The protective layer 130 may include an inorganic material. For example, the protective layer 130 may include silicon oxide, silicon nitride, aluminum nitride, and the like.

The bank 140 and the color conversion layer 200 may be disposed on or under the protective layer 130. The bank 140 may include a first opening region OP1 and a second opening region OP2. The first opening region OP1 may overlap (e.g., overlap in the thickness direction of the upper substrate 100) the light emitting element PX, and the second opening region OP2 may not overlap the light emitting element PX.

The second opening region OP2 may overlap (e.g., overlap in the thickness direction of the upper substrate 100) the light blocking region BA. The color conversion layer 200 may be disposed in the first opening region OP1. The color conversion layer 200 may convert the light emitted from the light emitting element PX into light having a specific wavelength. For example, the color conversion layer 200 may include color conversion particles including quantum dots (QDs).

The color conversion layer 200 may be formed by an inkjet scheme. For example, the color conversion layer 200 may be formed by dropping an ink including the color conversion particles in the first opening region OP1. However, the ink may not be dropped in the first opening region OP1. In other words, the ink may be erroneously jetted. The erroneously jetted ink may be classified into a first erroneously jetted ink, a second erroneously jetted ink, and a third erroneously jetted ink according to a location where the erroneously jetted ink is dropped. The first erroneously jetted ink (e.g., IDA of FIG. 17) may be an ink that is erroneously jetted in a central region CO or a peripheral region SO. The second erroneously jetted ink (e.g., IDB of FIG. 17) may be an ink that is erroneously jetted on a first partition wall W1 or a second partition wall W2. The third erroneously jetted ink (e.g., IDC of FIG. 17) may be an ink that is erroneously jetted in a first region A where the first partition wall W1 and the second partition wall W2 make contact with each other.

According to one or more embodiments, the color conversion layer 200 may include first to third color conversion layers 201, 202, and 203. The first color conversion layer 201 may include first color conversion particles, the second color conversion layer 202 may include scattering particles, and the third color conversion layer 203 may include second color conversion particles. Accordingly, the first color conversion layer 201 may convert the light emitted from the light emitting element PX into the first light, the second color conversion layer 202 may transmit the light emitted from the light emitting element PX, and the third color conversion layer 203 may convert the light emitted from the light emitting element PX into the third light.

The first color conversion particles may include a first scatterer and a first quantum dot having a first size. The first quantum dot may be excited by the light emitted from the light emitting element PX to emit the first light. Accordingly, the first color conversion layer 201 may convert the light emitted from the light emitting element PX into the first light.

The second color conversion layer 202 may include the scattering particles, and the light emitting element PX may emit the second light. Accordingly, the second color conversion layer 202 may transmit the second light emitted from the light emitting element PX. For example, the light emitting element PX may emit blue light, and the second color conversion layer 202 may transmit the blue light emitted from the light emitting element PX. As another example, the light emitting element PX may emit white light, and the second color conversion layer 202 may transmit the white light emitted from the light emitting element PX.

The second color conversion particles may include a second scatterer and a second quantum dot having a second size that is different from the first size. The second quantum dot may be excited by the light emitted from the light emitting element PX to emit the third light. Accordingly, the third color conversion layer 203 may convert the light emitted from the light emitting element PX into the third light.

According to one or more embodiments, the first opening region OP1 may include first to third color conversion regions CA1, CA2, and CA3. The first color conversion layer 201 may be disposed in the first color conversion region CA1. The first color conversion region CA1 may overlap (e.g., overlap in the thickness direction of the upper substrate 100) the first color filter layer 111. In addition, at least a portion of the first color conversion region CA1 may overlap (e.g., overlap in the thickness direction of the upper substrate 100) the transmissive region TA. Accordingly, the light emitted from the light emitting element PX may sequentially pass through the first color conversion layer 201 and the first color filter layer 111 so as to be visually recognized by the user as the first light having the first wavelength.

The second color conversion layer 202 may be disposed in the second color conversion region CA2. The second color conversion region CA2 may overlap (e.g., overlap in the thickness direction of the upper substrate 100) the second color filter layer 112. In addition, at least a portion of the second color conversion region CA2 may overlap (e.g., overlap in the thickness direction of the upper substrate 100) the transmissive region TA. Accordingly, the light emitted from the light emitting element PX may sequentially pass through the second color conversion layer 202 and the second color filter layer 112 so as to be visually recognized by the user as the second light having the second wavelength.

The third color conversion layer 203 may be disposed in the third color conversion region CA3. The third color conversion region CA3 may overlap (e.g., overlap in the thickness direction of the upper substrate 100) the third color filter layer 113. In addition, at least a portion of the third color conversion region CA3 may overlap (e.g., overlap in the thickness direction of the upper substrate 100) the transmissive region TA. Accordingly, the light emitted from the light emitting element PX may sequentially pass through the third color conversion layer 203 and the third color filter layer 113 so as to be visually recognized by the user as the third light having the third wavelength.

The second opening region OP2 may be partitioned by the first partition wall W1 and the second partition wall W2. The first partition wall W1 may partition the second opening region OP2 into a central region CO and a peripheral region SO. In one or more embodiments, the shape of the first partition wall W1 corresponds to the shape of the central region CO. The peripheral region SO may be around (e.g., surround) the central region CO. For example, the central region CO may denote a region surrounded by the first partition wall W1 in the second opening region OP2, and the peripheral region SO may denote a region outside the region surrounded by the first partition wall W1 in the second opening region OP2. The central region CO and the peripheral region SO may receive the first erroneously jetted ink.

The first partition wall W1 may have a polygonal shape including n vertices when viewed in a plan view (n is a natural number greater than or equal to 3). Accordingly, the central region CO may also have a polygonal shape when viewed in a plan view. Hereinafter, throughout the present disclosure, 'n' is defined as a term designating "a natural number greater than or equal to 3".

The second partition wall W2 may extend from each of the n vertices of the first partition wall W1 to an edge of the second opening region OP2. In other words, the second partition wall W2 may include n compartmental walls (e.g., P1 to P8 of FIG. 5). Accordingly, the second partition wall W2 may partition the peripheral region SO into n sub-regions (e.g., SO1 to SO8 of FIG. 5). For example, sub-regions of the peripheral region SO may be spaced from each other by a compartmental wall of the second partition wall W2. Each of the n compartmental walls may be perpendicular to the edge of the second opening region OP2. In one or more embodiments, each of the sides of the central region CO may be opposite (e.g., face) respective sub-regions of the peripheral region SO. For example, a sub-region of the peripheral region SO and another sub-region of the peripheral region SO may be opposite (e.g., face) each other with the central region CO therebetween.

The second opening region OP2 and the first opening region OP1 may be partitioned by the bank 140. The bank 140 (e.g., a portion of the bank 140) between the first opening region OP1 and the second opening region OP2 may be lost during a process of manufacturing the display device. For example, the bank 140 may be lost in a second region B between the second color conversion region CA2 and the second opening region OP2. Because the color conversion substrate 2000 according to the embodiments includes the first partition wall W1 and the second partition wall W2 that partition the second opening region OP2, even when the bank 140 is lost, the color conversion layer 200 disposed in the first opening region OP1 may be lost to only one of the n sub-regions.

According to one or more embodiments, an area of each of the n sub-regions may be smaller than an area of the central region CO. In other words, each of the n sub-regions may have a relatively small area. Accordingly, even when the bank 140 is lost, a relatively small amount of the color conversion layer 200 disposed in the first opening region OP1 may be lost (e.g., lost to an n sub-region).

In one or more embodiments, the first partition wall W1 may have a polygonal shape when viewed in a plan view, and the second partition wall W2 may extend from each of vertices of the polygonal shape to the second opening region. Accordingly, the first region A where the first partition wall W1 and the second partition wall W2 make contact with each other may have a relatively small area. Because the first region A has a relatively small area, even when the third erroneously jetted ink is dropped in the first region A, the third erroneously jetted ink may have a relatively small size. In this case, a protrusion having a relatively small size or substantially no protrusion may be formed in the first region A where the first partition wall W1 and the second partition wall W2 contact each other.

According to one or more embodiments, a first thickness D1 of the first partition wall W1 and a second thickness D2 of the second partition wall W2 may be different from each other. Accordingly, even when the third erroneously jetted ink is dropped in the first region A, the third erroneously jetted ink may have a relatively small size. In this case, a protrusion having a relatively small size or substantially no protrusion may be formed in the first region A where the first partition wall W1 and the second partition wall W2 contact each other.

According to one or more embodiments, the first thickness D1 may be about 5 µm or more and about 25 µm or less, and the second thickness D2 may be about 5 µm or more and about 25 µm or less. In one or more embodiments, for example, the first thickness D1 may be about 16 µm, and the second thickness D2 may be about 14 µm. When the first thickness D1 or the second thickness D2 is less than about 5 µm, durability of the first partition wall W1 or the second partition wall W2 may be relatively reduced. In other words, the first partition wall W1 or the second partition wall W2 may be lost during the process of manufacturing the display device. When the first thickness D1 or the second thickness D2 is greater than about 25 µm, the second erroneously jetted ink dropped on the first partition wall W1 or the second partition wall W2 may have a relatively large size. In this case, a relatively large protrusion may be formed on the first partition wall W1 or the second partition wall W2 when the second erroneously jetted ink is dropped on the first partition wall W1 or the second partition wall W2.

According to one or more embodiments, each of the n compartmental walls included in the second partition wall W2 may be configured such that an angle between one of the n compartmental walls and the first partition wall W1 making contact with the one compartmental wall may be greater than or equal to about 90 degrees. For example, an angle between a first compartmental wall P1 of FIG. 5 and a first side S1 of the first partition wall W1 of FIG. 5 may be greater than or equal to about 90 degrees, and an angle between the first compartmental wall P1 of FIG. 5 and a second side S2 of the first partition wall W1 of FIG. 5 may be greater than or equal to about 90 degrees. Accordingly, the first region A may have a relatively small area, and even when the third erroneously jetted ink is dropped in the first region A, the third erroneously jetted ink may have a relatively small size. In this case, a protrusion having a relatively small size or substantially no protrusion may be formed in the first region A where the first partition wall W1 and the second partition wall W2 contact each other.

The first to third color conversion regions CA1, CA2, and CA3 may be partitioned by the bank 140. For example, the bank 140 may be disposed between the first color conversion region CA1 and the second color conversion region CA2. The bank 140 may block light emitted from the first color conversion region CA1 from being irradiated to the second color conversion region CA2 or the third color conversion region CA3, block light emitted from the second color conversion region CA2 from being irradiated to the first color conversion region CA1 or the third color conversion region CA3, and block light emitted from the third color conversion region CA3 from being irradiated to the first color conversion region CA1 or the second color conversion region CA2.

In one or more embodiments, the first light may be red light, the second light may be blue light, and the third light may be green light. Alternatively, the first light may be green light, the second light may be blue light, and the third light may be red light.

The color filter layer 110 and the color conversion layer 200 according to the embodiments of the present disclosure are not limited to the above-described embodiments. For example, the first color filter layer 111 may selectively transmit the third light, the second color filter layer 112 may selectively transmit the first light, and the third color filter layer 113 may selectively transmit the second light. In this case, the first color conversion layer 201 may convert the light emitted from the light emitting element PX into the third light, the second color conversion layer 202 may convert the light emitted from the light emitting element PX into the first light, and the third color conversion layer 203 may transmit the light emitted from the light emitting element PX.

Figure 5:
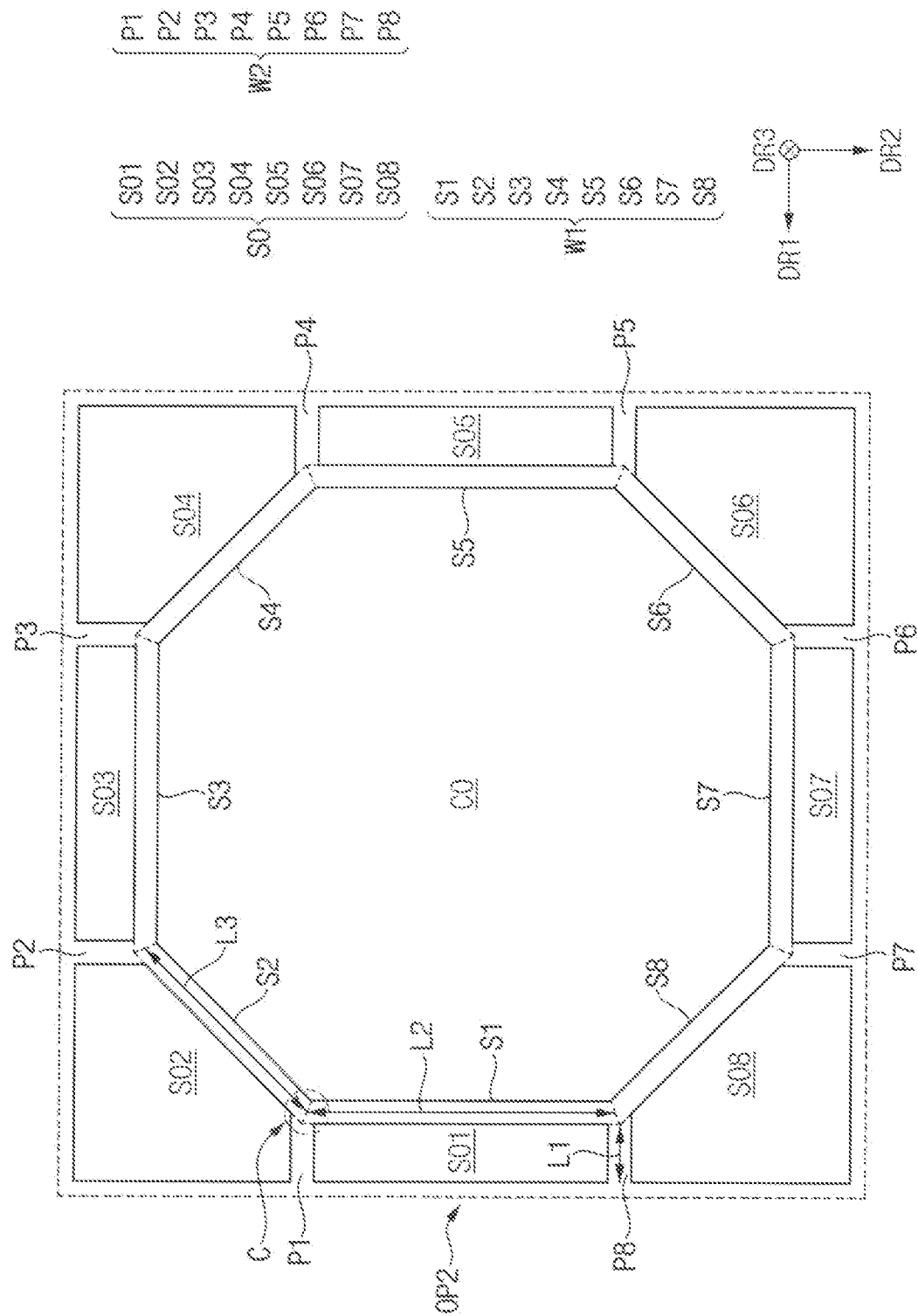
FIGS. 5 to 7 are plan views showing a second opening region of the color conversion substrate of FIG. 2.

FIG. 5 is a plan view showing a second opening region according to one or more embodiments of the present disclosure. FIG. 5 may be an enlarged plan view showing the second opening region OP2 of FIG. 2.

Referring to FIG. 5, the first partition wall W1 may have an octagonal shape including a first side S1, a second side S2 making contact with the first side S1, a third side S3 making contact with the second side S2, a fourth side S4 making contact with the third side S3, a fifth side S5 making contact with the fourth side S4, a sixth side S6 making contact with the fifth side S5, a seventh side S7 making contact with the sixth side S6, and an eighth side S8 making contact with the first side S1 and the seventh side S7 when viewed in a plan view.

Accordingly, the second partition wall W2 may include a first compartmental wall P1 making contact with the first side S1 and the second side S2, a second compartmental wall P2 making contact with the second side S2 and the third side S3, a third compartmental wall P3 making contact with the third side S3 and the fourth side S4, a fourth compartmental wall P4 making contact with the fourth side S4 and the fifth side S5, a fifth compartmental wall P5 making contact with the fifth side S5 and the sixth side S6, a sixth compartmental wall P6 making contact with the sixth side S6 and the seventh side S7, a seventh compartmental wall P7 making contact with the seventh side S7 and the eighth side S8, and an eighth compartmental wall P8 making contact with the eighth side S8 and the first side S1. The first to eighth compartmental walls P1, P2, P3, P4, P5, P6, P7, and P8 may extend from eight vertices of the first partition wall W1 having an octagonal shape to the edge of the second opening region OP2 when viewed in a plan view, respectively. In one or more embodiments, each of the first to eighth compartmental walls P1, P2, P3, P4, P5, P6, P7, and P8 may extend from a respective vertex of the first partition wall W1 to an adjacent portion of the edge of the second opening region OP2 as illustrated in FIG. 5.

The central region CO may have an octagonal shape surrounded by the first to eighth sides S1, S2, S3, S4, S5, S6, S7, and S8 of the first partition wall W1 when viewed in a plan view. The first to eighth compartmental walls P1, P2, P3, P4, P5, P6, P7, and P8 may partition the peripheral region SO into first to eighth sub-regions SO1, SO2, SO3, SO4, SO5, SO6, SO7, and SO8. For example, the first sub-region SO1 may be defined as a region partitioned by the first and eighth compartmental walls P1 and P8, the first side S1 of the first partition wall W1, and the edge of the second opening region OP2.

The first to eighth sides S1, S2, S3, S4, S5, S6, S7, and S8 and the first to eighth compartmental walls P1, P2, P3, P4, P5, P6, P7, and P8 may have various suitable arrangements. For example, the first to eighth sides S1, S2, S3, S4, S5, S6, S7, and S8 and the first to eighth compartmental walls P1, P2, P3, P4, P5, P6, P7, and P8 may have various suitable arrangements capable of allowing the first to eighth sub-regions SO1, SO2, SO3, SO4, SO5, SO6, SO7, and SO8 to have a relatively small area, and allowing a region where the first partition wall W1 and the second partition wall W2 make contact with each other (e.g., a region C, which is a region where the first compartmental wall P1 and the first partition wall W1 make contact with each other) to have a relatively small area.

According to one or more embodiments, the first side S1 and the fifth side S5 may extend in a second direction DR2, and the third side S3 and the seventh side S7 may extend in a first direction DR1 that is perpendicular to the second direction DR2. For example, each of the first compartmental wall P1 and the eighth compartmental wall P8 may be perpendicular to the first side S1, each of the second compartmental wall P2 and the third compartmental wall P3 may be perpendicular to the third side S3, each of the fourth compartmental wall P4 and the fifth compartmental wall P5 may be perpendicular to the fifth side S5, and each of the sixth compartmental wall P6 and the seventh compartmental wall P7 may be perpendicular to the seventh side S7.

According to one or more embodiments, each of the first to eighth compartmental walls P1, P2, P3, P4, P5, P6, P7, and P8 may have a first length L1, each of the first, third, fifth, and seventh sides S1, S3, S5, and S7 may have a second length L2, and each of the second, fourth, sixth, and eighth sides S2, S4, S6, and S8 may have a third length L3. The first length L1 and the second length L2 may be different from each other, and the third length L3 may be different from the first length L1 and the second length L2. For example, the first length L1 may be smaller than the second length L2. In addition, the first length L1 may be smaller than the third length L3. In one or more embodiments, the second length L2 may be different from the third length L3.

According to one or more embodiments, the first to eighth sides S1, S2, S3, S4, S5, S6, S7, and S8 and the first to eighth compartmental walls P1, P2, P3, P4, P5, P6, P7, and P8 may be symmetrically arranged with respect to the first direction DR1 (e.g., symmetrically arranged about a reference line extending through a center of the central region CO in the first direction DR1), and may be symmetrically arranged with respect to the second direction DR2 (e.g., symmetrically arranged about a reference line extending through a center of the central region CO in the second direction DR2).

Figure 6:
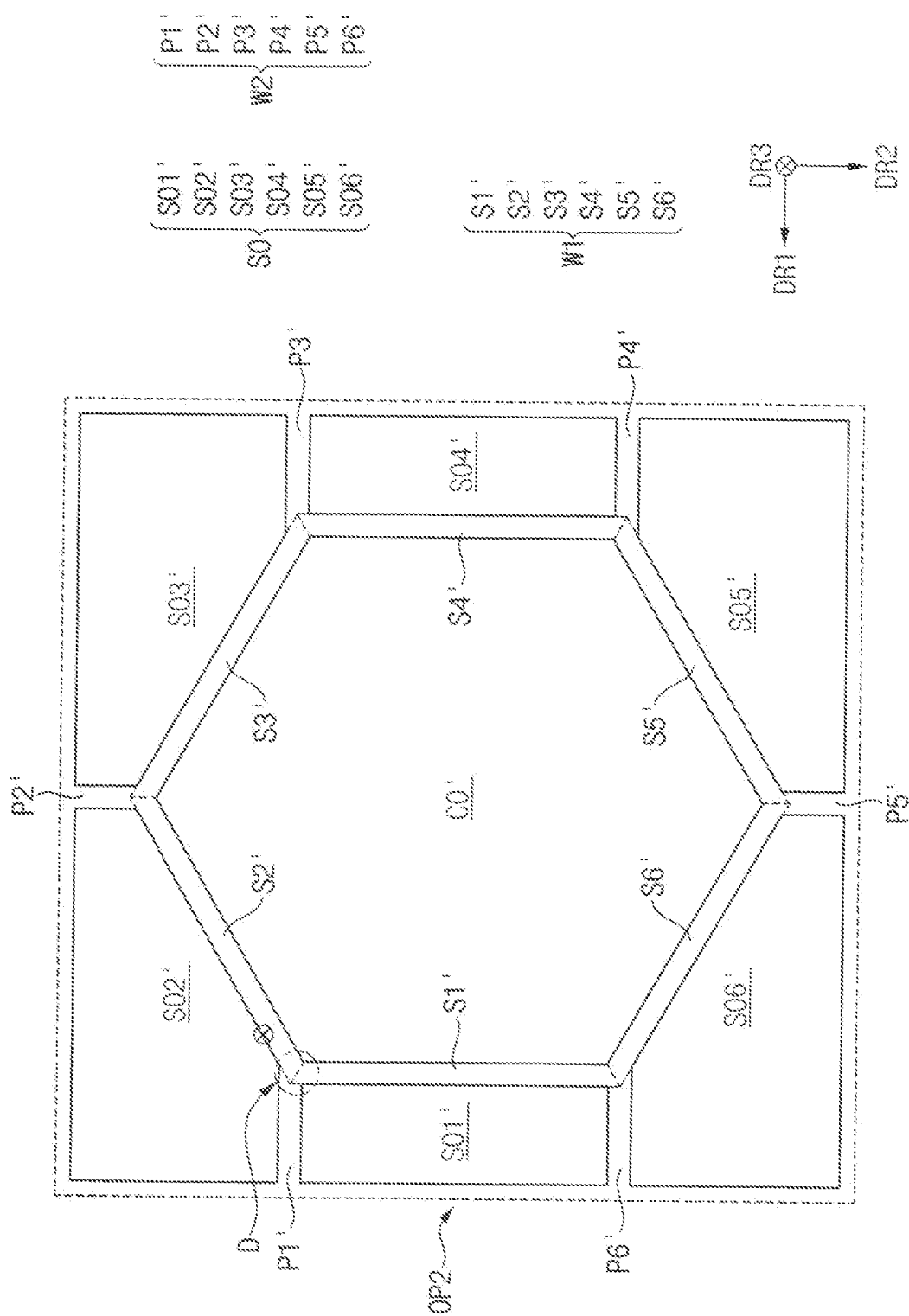

FIG. 6 is a plan view showing a second opening region according to another embodiment of the present disclosure.

Referring to FIG. 6, the first partition wall W1 may have a hexagonal shape including a first side S1', a second side S2' making contact with the first side S1', a third side S3' making contact with the second side S2', a fourth side S4' making contact with the third side S3', a fifth side S5' making contact with the fourth side S4', and a sixth side S6' making contact with the first side S1' and the fifth side S5' when viewed in a plan view.

Accordingly, the second partition wall W2 may include a first compartmental wall P1' making contact with the first side S1' and the second side S2', a second compartmental wall P2' making contact with the second side S2' and the third side S3', a third compartmental wall P3' making contact with the third side S3' and the fourth side S4', a fourth compartmental wall P4' making contact with the fourth side S4' and the fifth side S5', a fifth compartmental wall P5' making contact with the fifth side S5' and the sixth side S6', and a sixth compartmental wall P6' making contact with the first side S1' and the sixth side S6'. The first to sixth compartmental walls P1', P2', P3', P4', P5', and P6' may extend from six vertices of the first partition wall W1 having a hexagonal shape to the edge of the second opening region OP2 when viewed in a plan view, respectively. In one or more embodiments, each of the first to sixth compartmental walls P1', P2', P3', P4', P5', and P6' may extend from a respective vertex of the first partition wall W1 to an adjacent portion of the edge of the second opening region OP2 as illustrated in FIG. 6.

A central region CO' may have a hexagonal shape surrounded by the first to sixth sides S1', S2', S3', S4', S5', and S6' when viewed in a plan view. The first to sixth compartmental walls P1', P2', P3', P4', P5', and P6' may partition the peripheral region SO into first to sixth sub-regions SO1', SO2', SO3', SO4', SO5', and SO6'. For example, the first sub-region SO1' may be defined as a region partitioned by the first and sixth compartmental walls P1' and P6', the first side S1' of the first partition wall W1, and the edge of the second opening region OP2.

The first to sixth sides S1', S2', S3', S4', S5', and S6' and the first to sixth compartmental walls P1', P2', P3', P4', P5', and P6' may have various suitable arrangements. For example, the first to sixth sides S1', S2', S3', S4', S5', and S6' and the first to sixth compartmental walls P1', P2', P3', P4', P5', and P6' may have various suitable arrangements capable of allowing the first to sixth sub-regions SO1', SO2', SO3', SO4', SO5', and SO6' to have a relatively small area, and allowing a region where the first partition wall W1 and the second partition wall W2 make contact with each other (e.g., a region D, which is a region where the first compartmental wall P1' and the first partition wall W1 make contact with each other) to have a relatively small area.

According to one or more embodiments, the first side S1' and the fourth side S4' may be parallel to each other, the second side S2' and the fifth side S5' may be parallel to each other, and the third side S3' and the sixth side S6' may be parallel to each other. In this case, each of the first compartmental wall P1' and the sixth compartmental wall P6' may be perpendicular to the first side S1', and each of the third compartmental wall P3' and the fourth compartmental wall P4' may be perpendicular to the fourth side S4'.

According to one or more embodiments, the first to sixth sides S1', S2', S3', S4', S5', and S6' and the first to sixth compartmental walls P1', P2', P3', P4', P5', and P6' may be symmetrically arranged with respect to the first direction DR1 (e.g., symmetrically arranged about a reference line extending through a center of the central region CO' in the first direction DR1), and may be symmetrically arranged with respect to the second direction DR2 (e.g., symmetrically arranged about a reference line extending through a center of the central region CO' in the second direction DR2).

Figure 7:
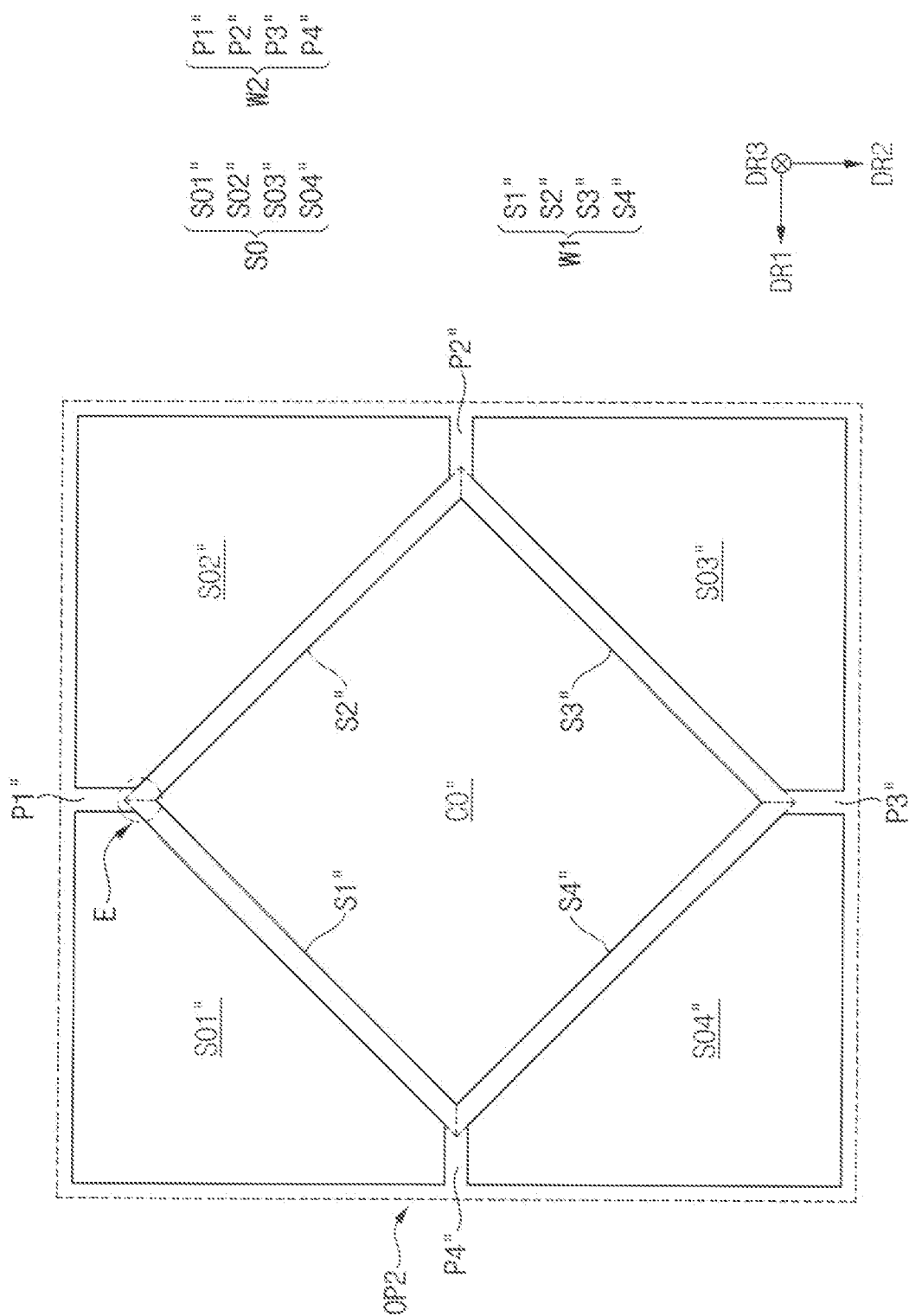

FIG. 7 is a plan view showing a second opening region according to still another embodiment of the present disclosure.

Referring to FIG. 7, the first partition wall W1 may have a rectangular shape including a first side S1", a second side S2" making contact with the first side S1", a third side S3" making contact with the second side S2", and a fourth side S4" making contact with the first side S1" and the third side S3" when viewed in a plan view.

Accordingly, the second partition wall W2 may include a first compartmental wall P1" making contact with the first side S1" and the second side S2", a second compartmental wall P2" making contact with the second side S2" and the third side S3", a third compartmental wall P3" making contact with the third side S3" and the fourth side S4", and a fourth compartmental wall P4" making contact with the first side S1" and the fourth side S4". The first to fourth compartmental walls P1", P2", P3", and P4" may extend from four vertices of the first partition wall W1 having a rectangular shape to the edge of the second opening region OP2 when viewed in a plan view, respectively. In one or more embodiments, each of the first to fourth compartmental walls P1", P2", P3", and P4" may extend from a respective vertex of the first partition wall W1 to an adjacent portion of the edge of the second opening region OP2 as illustrated in FIG. 7.

A central region CO" may have a rectangular shape surrounded by the first to fourth sides S1", S2", S3", and S4" when viewed in a plan view. The first to fourth compartmental walls P1", P2", P3", and P4" may partition the peripheral region SO into first to fourth sub-regions 501", SO2", SO3", and SO4". For example, the first sub-region SO1" may be defined as a region partitioned by the first and fourth compartmental walls P1" and P4", the first side S1" of the first partition wall W1, and the edge of the second opening region OP2.

The first to fourth sides S1", S2", S3", and S4" and the first to fourth compartmental walls P1", P2", P3", and P4" may have various suitable arrangements. For example, the first to fourth sides S1", S2", S3", and S4" and the first to fourth compartmental walls P1", P2", P3", and P4" may have various suitable arrangements capable of allowing the first to fourth sub-regions SO1", SO2", SO3", and SO4" to have a relatively small area, and allowing a region where the first partition wall W1 and the second partition wall W2 make contact with each other (e.g., a region E, which is a region where the first compartmental wall P1" and the first partition wall W1 make contact with each other) to have a relatively small area.

Figure 8:
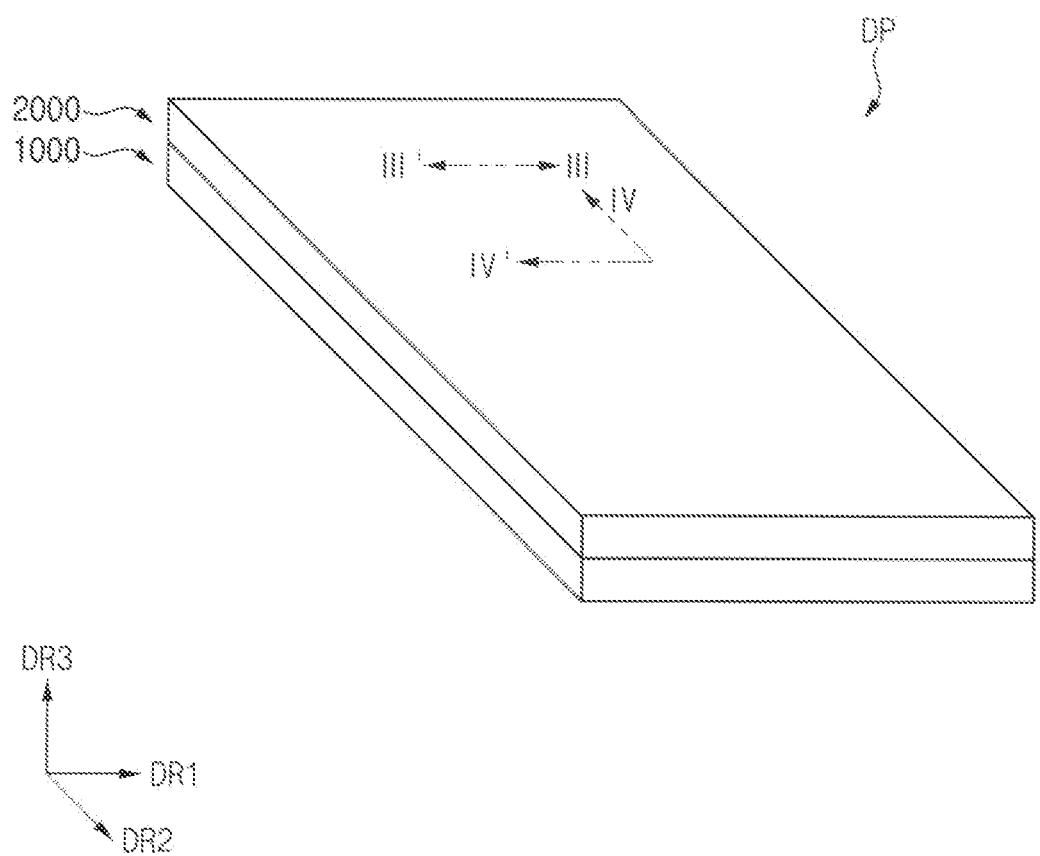
FIG. 8 is a perspective view showing a display device according to one or more embodiments of the present disclosure.
Figure 9:
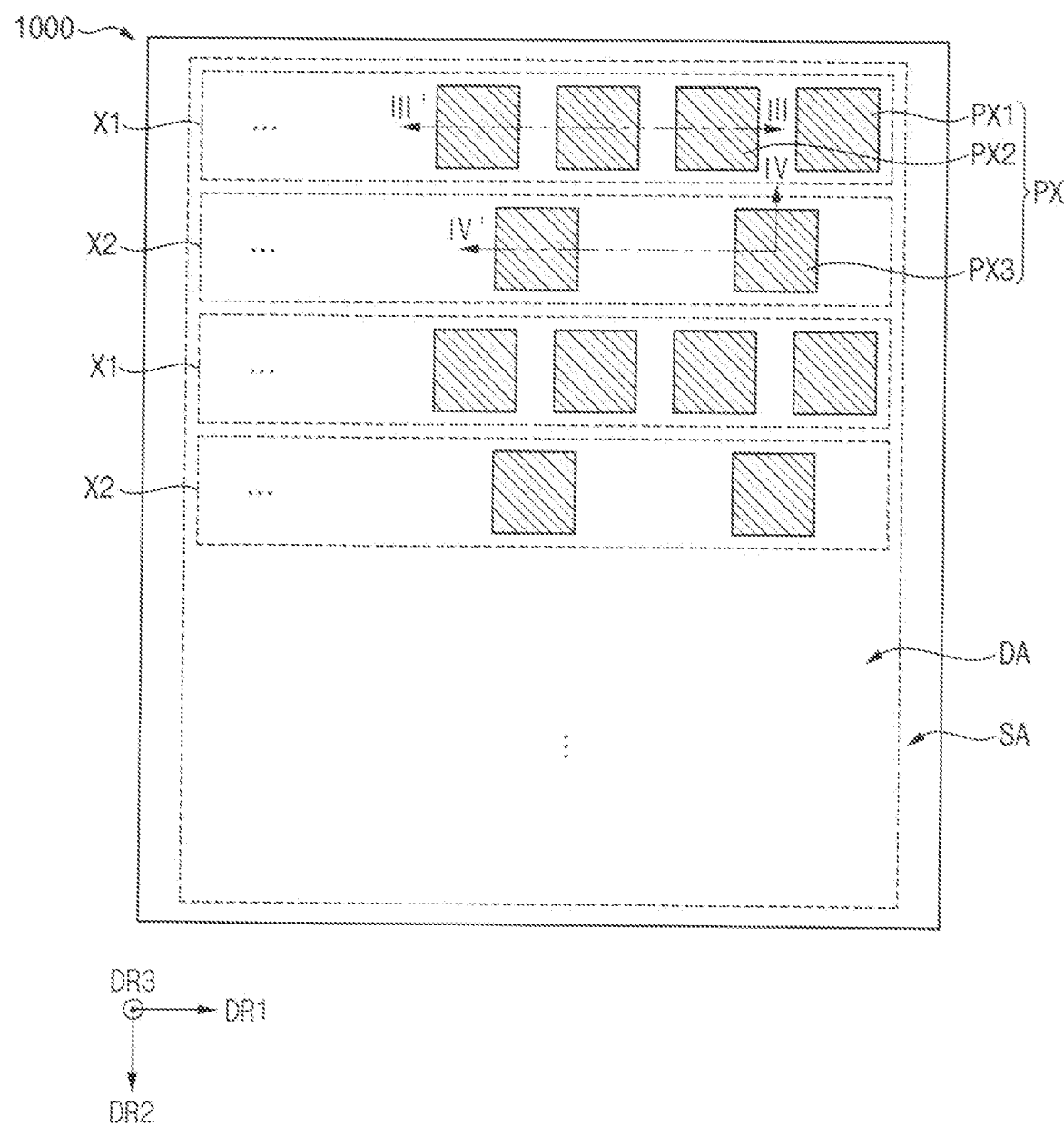
FIG. 9 is a plan view showing an array substrate included in the display device of FIG. 8.
Figure 10:
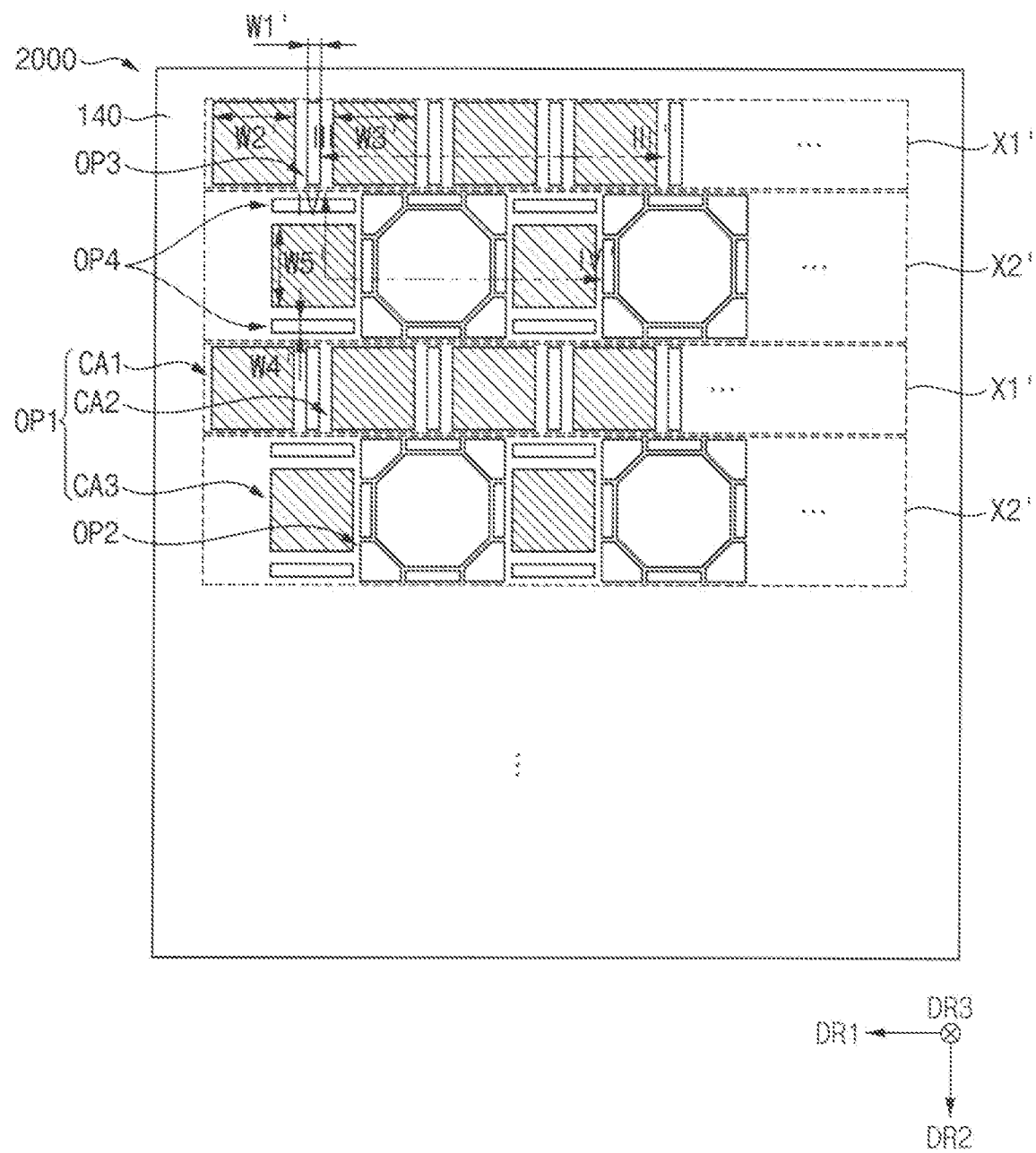
FIG. 10 is a plan view showing a color conversion substrate included in the display device of FIG. 8.
Figure 11:
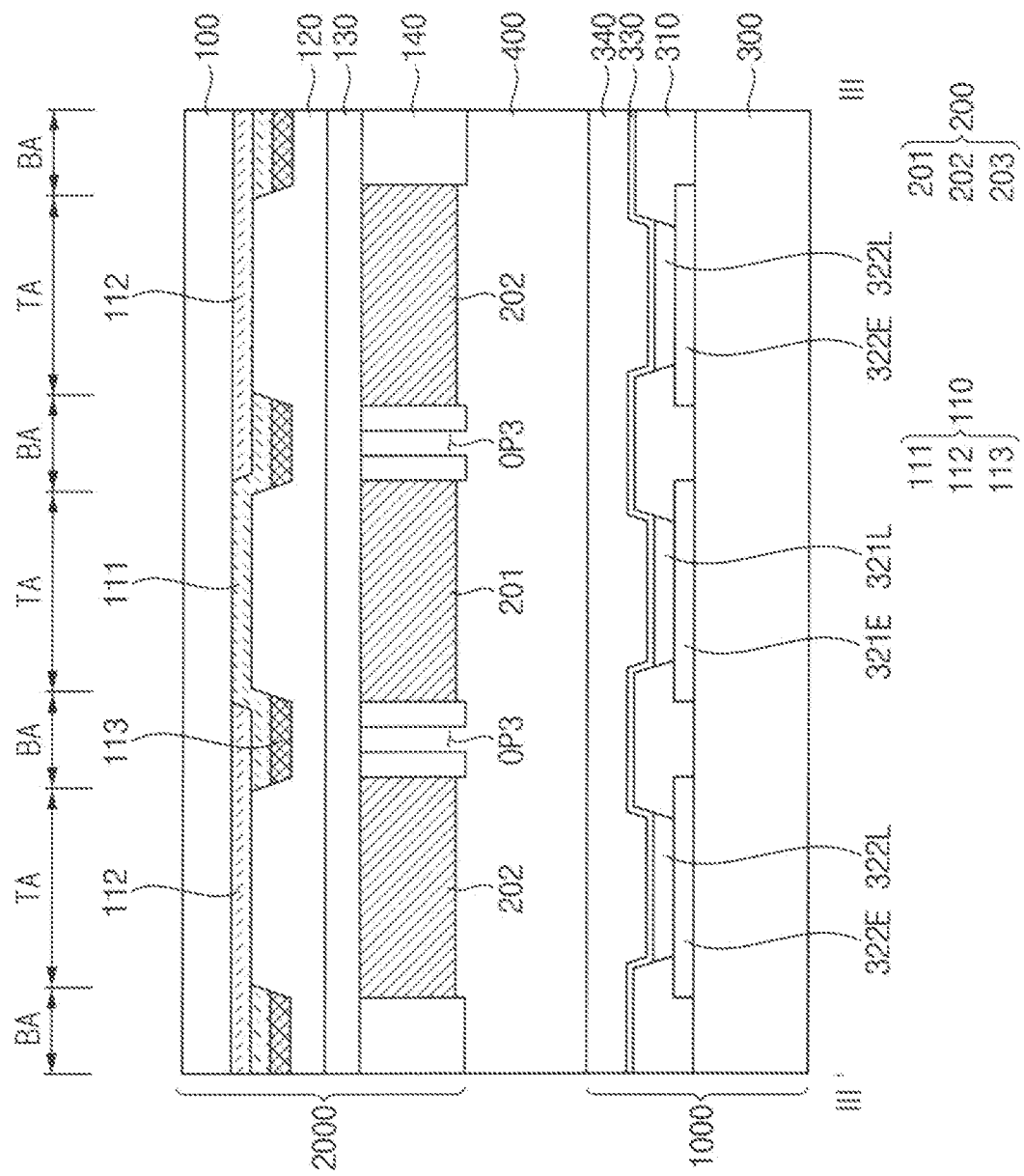
FIG. 11 is a sectional view taken along the line of FIG. 8.
Figure 12:
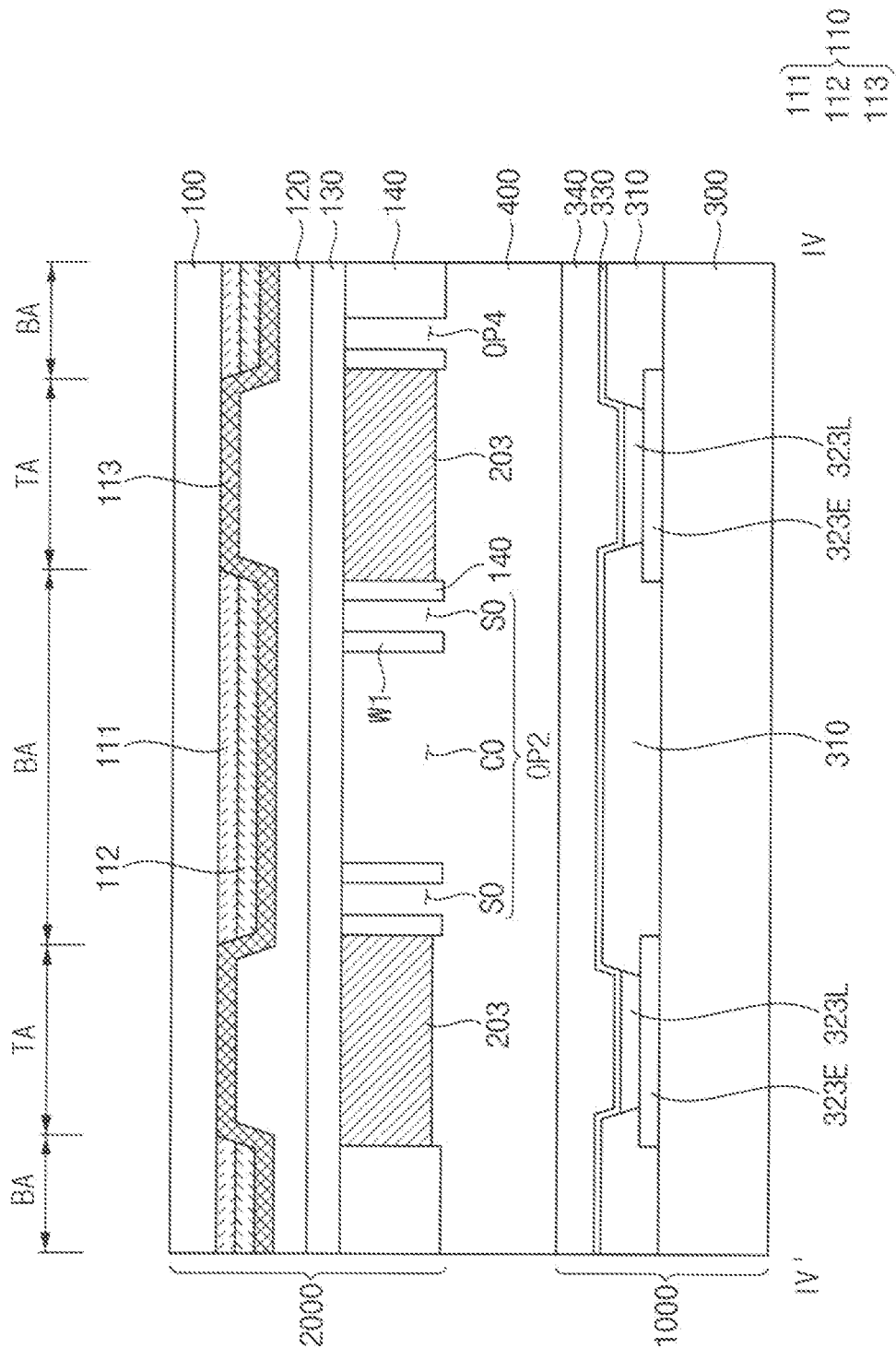
FIG. 12 is a sectional view taken along the line IV-IV' of FIG. 8.

FIG. 8 is a perspective view showing a display device according to one or more embodiments of the present disclosure. FIG. 9 is a plan view showing an array substrate included in the display device of FIG. 8. FIG. 10 is a plan view showing a color conversion substrate included in the display device of FIG. 8. FIG. 11 is a sectional view taken along the line III-III' of FIG. 8. FIG. 12 is a sectional view taken along the line IV-IV' of FIG. 8. FIG. 9 may be a plan view showing an array substrate 1000 of FIG. 8 when viewed in a direction opposite to the third direction DR3, and FIG. 10 may be a plan view showing a color conversion substrate 2000 of FIG. 8 when viewed in the third direction DR3.

Referring to FIG. 8, FIG. 8 may be a perspective view showing a state in which the array substrate 1000 and the color conversion substrate 2000 of FIG. 1 are coupled to each other. In other words, the array substrate 1000 of FIG. 8 may be substantially the same as the array substrate 1000 described with reference to FIGS. 1 to 7, and the color conversion substrate 2000 of FIG. 8 may be substantially the same as the color conversion substrate 2000 described with reference to FIGS. 1 to 7 except for a third opening region OP3 and the fourth opening region OP4. Therefore, redundant descriptions of configurations of FIGS. 1 to 7 may not be repeated below.

Referring to FIGS. 8, 9, 11, and 12, the array substrate 1000 may include a lower substrate 300, a pixel defining layer 310, first to third electrodes 321E, 322E, and 323E, first to third light emitting layers 321L, 322L, and 323L, a common electrode 330, and an encapsulation layer 340. The array substrate 1000 may include a light emitting element PX. The light emitting element PX may include first to third light emitting elements PX1, PX2, and PX3. The first light emitting element PX1 may include the first electrode 321E and the first light emitting layer 321L, the second light emitting element PX2 may include the second electrode 322E and the second light emitting layer 322L, and the third light emitting element PX3 may include the third electrode 323E and the third light emitting layer 323L. The light emitting element PX may be disposed in a display region DA.

The lower substrate 300 may include at least one transistor and at least one driver. The transistor may be electrically connected to the driver. The transistor may generate an electrical signal. The transistor may be disposed in the display region DA. The driver may be disposed in a peripheral region SA surrounding the display region DA. Although an embodiment in which the peripheral region SA surrounds the display region DA has been shown in FIG. 9, the present disclosure is not limited thereto. For example, the peripheral region SA may be omitted, and the driver may be disposed in the display region DA.

The first to third electrodes 321E, 322E, and 323E may be disposed on the lower substrate 300. Each of the first to third electrodes 321E, 322E, and 323E may be electrically connected to the transistor. The first to third electrodes 321E, 322E, and 323E may be referred to as anode electrodes.

The pixel defining layer 310 may be disposed on the lower substrate 300. The pixel defining layer 310 may include first to third openings that partially expose top surfaces of the first to third electrodes 321E, 322E, and 323E, respectively.

The first to third light emitting layers 321L, 322L, and 323L may be disposed on the first to third electrodes 321E, 322E, and 323E exposed by the first to third openings, respectively. For example, the first light emitting layer 321L may be disposed on the first electrode 321E exposed by the first opening. The first to third light emitting layers 321L, 322L, and 323L may emit light having a luminance corresponding to a level of the electric signal. For example, the first to third light emitting layers 321L, 322L, and 323L may emit blue light. As another example, the first to third light emitting layers 321L, 322L, and 323L may emit white light.

The common electrode 330 may be disposed on the pixel defining layer 310 and the first to third light emitting layers 321L, 322L, and 323L. The common electrode 330 may be referred to as a cathode electrode.

The encapsulation layer 340 may cover the common electrode 330. The encapsulation layer 340 may include a first inorganic layer, a first organic layer, and a second inorganic layer. The first inorganic layer may be disposed on and cover the common electrode 330, the first organic layer may be disposed on and cover the first inorganic layer, and the second inorganic layer may be disposed on and cover the first organic layer. The encapsulation layer 340 may block external impurities.

According to one or more embodiments, the array substrate 1000 may include a first light emitting element row X1 and a second light emitting element row X2. The first light emitting element row X1 may include a first light emitting element PX1 and a second light emitting element PX2, which are alternately arranged in or along the first direction DR1, and the second light emitting element row X2 may include third light emitting elements PX3 arranged (e.g., repeatedly arranged) in or along the first direction DR1. The second light emitting element row X2 may be spaced from the first light emitting element row X1 in the second direction DR2. The first light emitting element row X1 and the second light emitting element row X2 may be alternately arranged in or along the second direction DR2. Each of the first light emitting element PX1, the second light emitting element PX2, and the third light emitting element PX3 may have a square shape having the same area when viewed in a plan view.

According to one or more embodiments, each of the first light emitting element PX1, the second light emitting element PX2, and the third light emitting element PX3 may have a circular shape when viewed in a plan view. Alternatively, each of the first light emitting element PX1, the second light emitting element PX2, and the third light emitting element PX3 may have a polygonal shape when viewed in a plan view. In one or more embodiments, the first light emitting element PX1, the second light emitting element PX2, and the third light emitting element PX3 may have mutually different areas. For example, an area of the third light emitting element PX3 may be larger than an area of the second light emitting element PX2 and/or an area of the first light emitting element PX1 when viewed in a plan view.

Referring to FIGS. 8 to 12, the array substrate 1000 and the color conversion substrate 2000 may overlap each other. In detail, the light emitting element PX of the array substrate 1000 may overlap (e.g., overlap in the thickness direction of the upper substrate 100) the first opening region OP1 of the color conversion substrate 2000. For example, the first color conversion region CA1 may overlap (e.g., overlap in the thickness direction of the upper substrate 100) the first light emitting element PX1, the second color conversion region CA2 may overlap (e.g., overlap in the thickness direction of the upper substrate 100) the second light emitting element PX2, and the third color conversion region CA3 may overlap (e.g., overlap in the thickness direction of the upper substrate 100) the third light emitting element PX3.

The color conversion substrate 2000 may include a first color conversion row X1' and a second color conversion row X2'. The first color conversion row X1' may include the first color conversion region CA1 and the second color conversion region CA2, which are alternately arranged in or along the first direction DR1, and the second color conversion row X2' may include the third color conversion region CA3 and the second opening region OP2, which are alternately arranged in or along the first direction DR1. The first color conversion row X1' and the second color conversion row X2' may be alternately arranged in or along the second direction DR2.

According to one or more embodiments, each of the first color conversion region CA1, the second color conversion region CA2, and the third color conversion region CA3 may have a rectangular shape having a first area when viewed in a plan view. The second opening region OP2 may have a rectangular shape having a second area that is larger than the first region when viewed in a plan view.

According to one or more embodiments, each of the first color conversion region CA1, the second color conversion region CA2, and the third color conversion region CA3 may have a circular shape when viewed in a plan view. Alternatively, each of the first color conversion region CA1, the second color conversion region CA2, and the third color conversion region CA3 may have a polygonal shape when viewed in a plan view. In this case, the second opening region OP2 may have various suitable shapes capable of minimizing or reducing a thickness of the bank 140 that partitions the first opening region OP1 and the second opening region OP2 when viewed in a plan view.

According to one or more embodiments, the first color conversion region CA1, the second color conversion region CA2, and the third color conversion region CA3 may have mutually different areas when viewed in a plan view. For example, an area of the third color conversion region CA3 may be larger than an area of the second color conversion region CA2 when viewed in a plan view, and the area of the second color conversion region CA2 may be larger than an area of the first color conversion region CA1 when viewed in a plan view.

According to one or more embodiments, the area of the third color conversion region CA3 may be larger than the area of the first color conversion region CA1, and larger than the area of the second color conversion region CA2 when viewed in a plan view. In this case, the area of the first color conversion region CA1 and the area of the second color conversion region CA2 may be substantially the same when viewed in a plan view.

According to one or more embodiments, the color conversion substrate 2000 may further include a third opening region OP3 and a fourth opening region OP4. The third opening region OP3 may be located between the first color conversion region CA1 and the second color conversion region CA2. A width W1' of the third opening region OP3 in the first direction DR1 may be smaller than a width W2' of the first color conversion region CA1 in the first direction. In addition, the width W1' of the third opening region OP3 in the first direction DR1 may be smaller than a width W3' of the second color conversion region CA2 in the first direction. The fourth opening region OP4 may be located between the third color conversion region CA3 and the first color conversion row X1'. A width W4' of the fourth opening region OP4 in the second direction DR2 may be smaller than a width W5' of the third color conversion region CA3 in the second direction DR2.

The third opening region OP3 may prevent or substantially prevent the first color conversion layer 201 in the first color conversion region CA1 from being lost to the second color conversion region CA2 that is adjacent to the first color conversion layer 201. In addition, the third opening region OP3 may prevent or substantially prevent the second color conversion layer 202 in the second color conversion region CA2 from being lost to the first color conversion region CA1 that is adjacent to the second color conversion layer 202.

The fourth opening region OP4 may prevent or substantially prevent the third color conversion layer 203 in the third color conversion region CA3 from being lost to the first and second color conversion regions CA1 and CA2 that are adjacent to the third color conversion layer 203. In addition, the fourth opening region OP4 may prevent or substantially prevent the first and second color conversion layers 201 and 202 in the first and second color conversion regions CA1 and CA2 from being lost to the third color conversion region CA3.

According to one or more embodiments, a filling layer 400 may be disposed between the color conversion substrate 2000 and the array substrate 1000. The filling layer 400 may include a transmissive transparent material. The filling layer 400 may maintain a filling gap between the color conversion substrate 2000 and the array substrate 1000. In addition, the filling layer 400 may be disposed in the first to fourth opening regions OP1, OP2, OP3, and OP4. In one or more embodiments, the filling layer 400 may be omitted.

Figure 13:
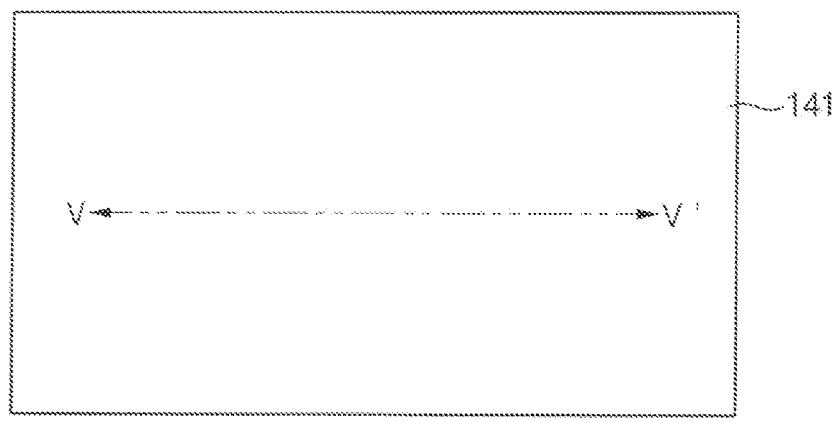
FIGS. 13 to 21 are views showing a method of manufacturing a color conversion substrate according to one or more embodiments of the present disclosure.
Figure 14:
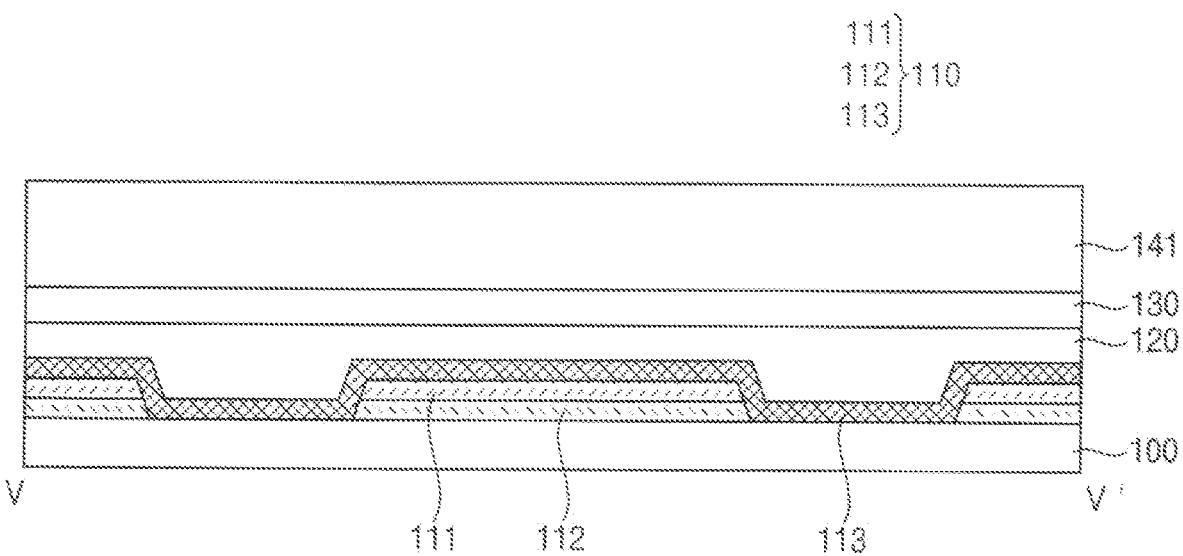
Figure 15:
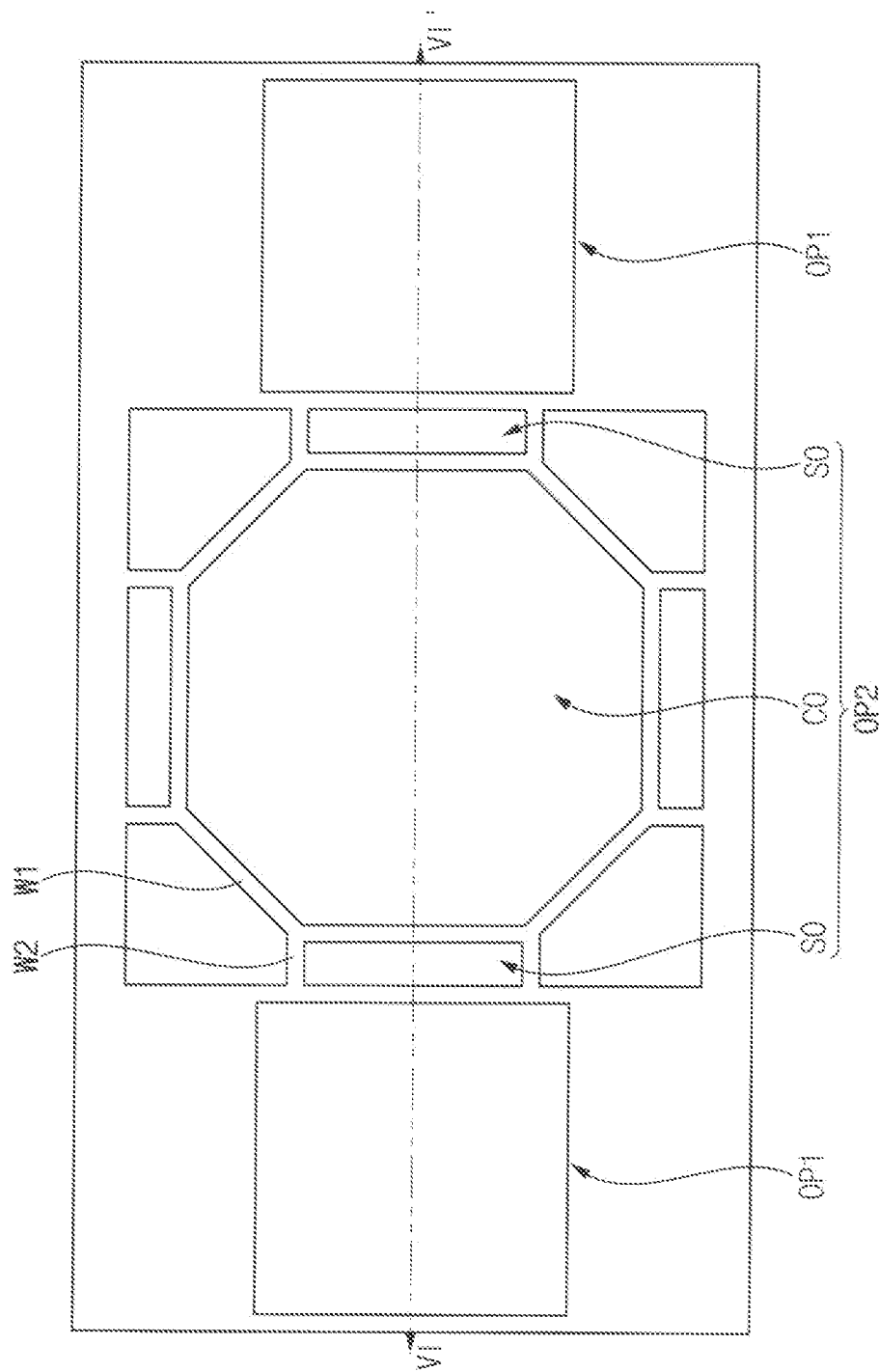
Figure 16:
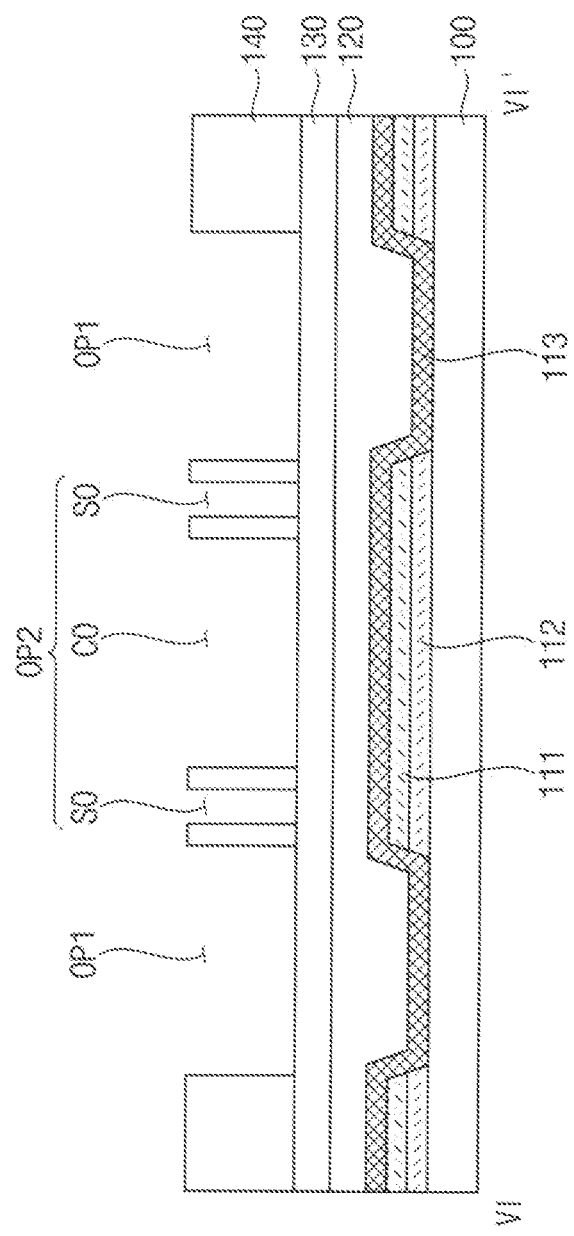
Figure 17:
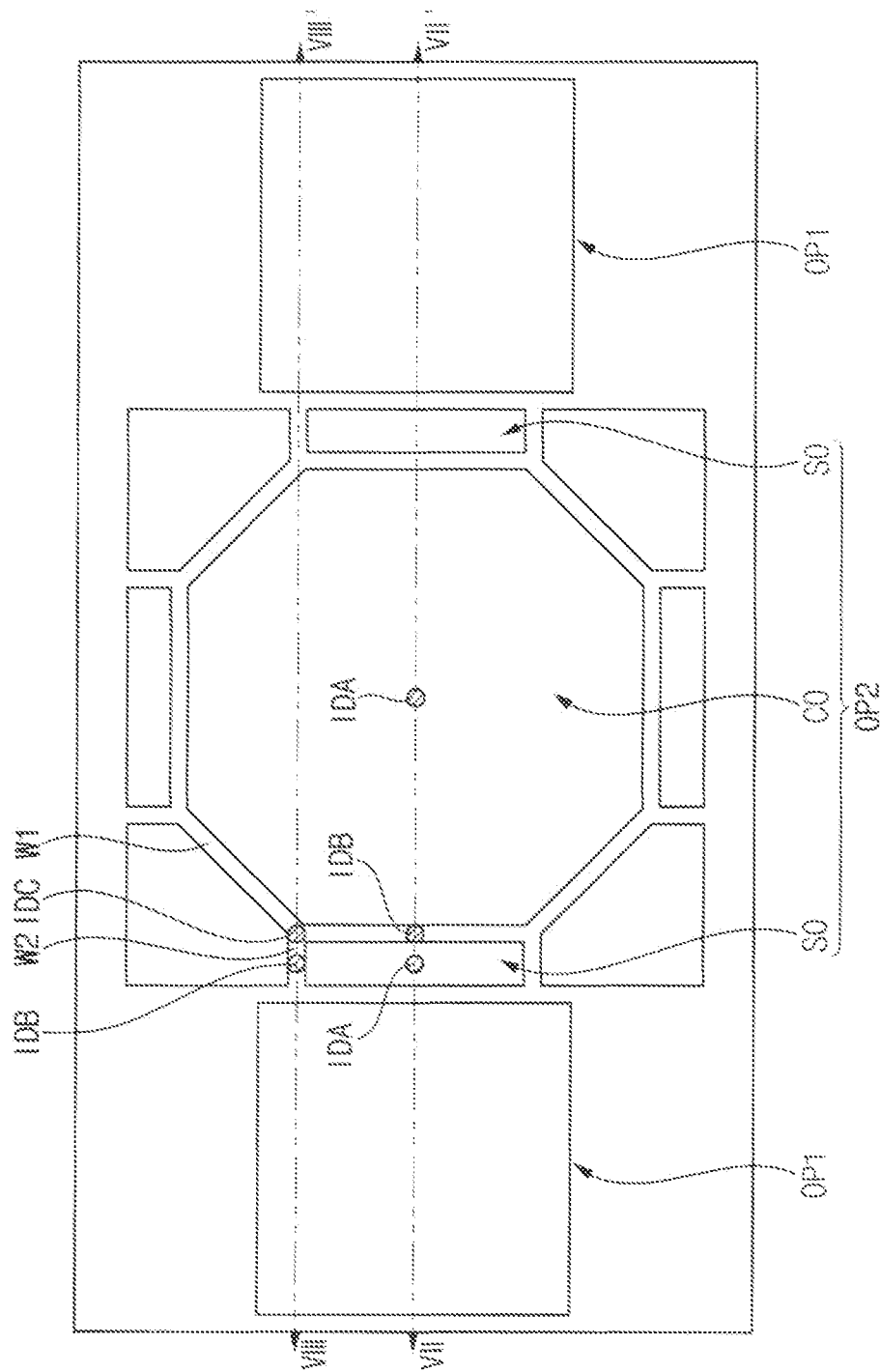
Figure 18:
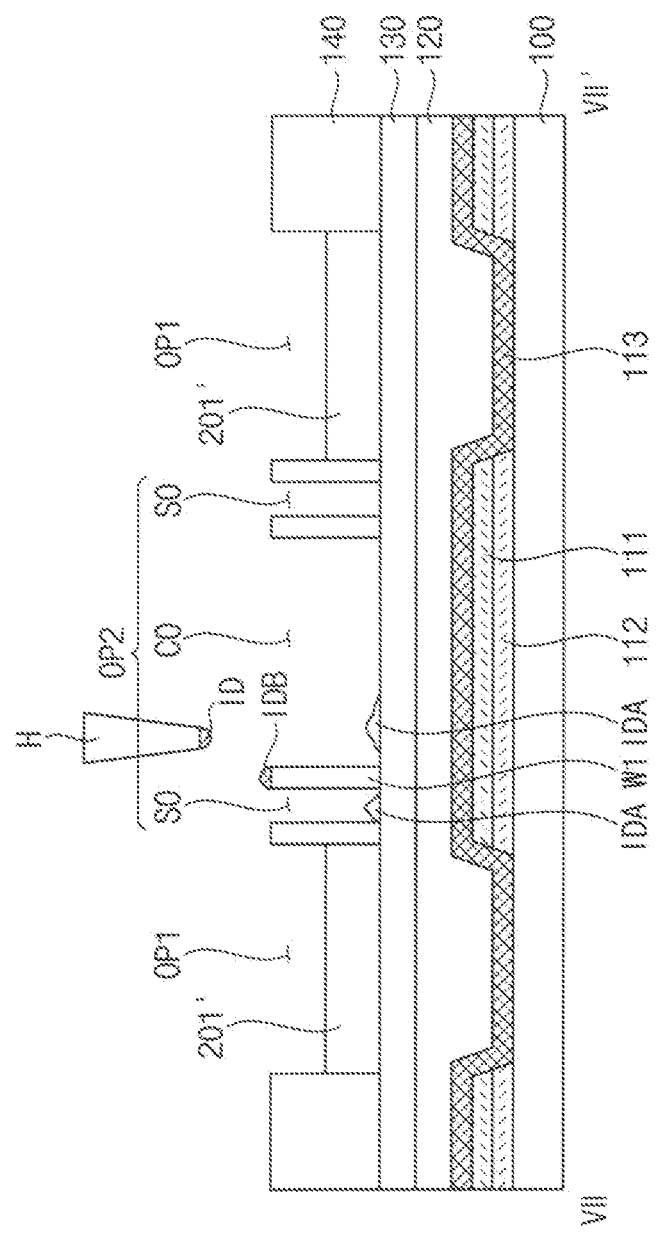

FIGS. 13 to 21 are views showing a method of manufacturing a color conversion substrate according to one or more embodiments of the present disclosure. FIG. 14 is a sectional view taken along the line V-V' of FIG. 13, FIG. 16 is a sectional view taken along the line VI-VI' of FIG. 15, FIG. 18 is a sectional view taken along the line VII-VII' of FIG.

Figure 19:
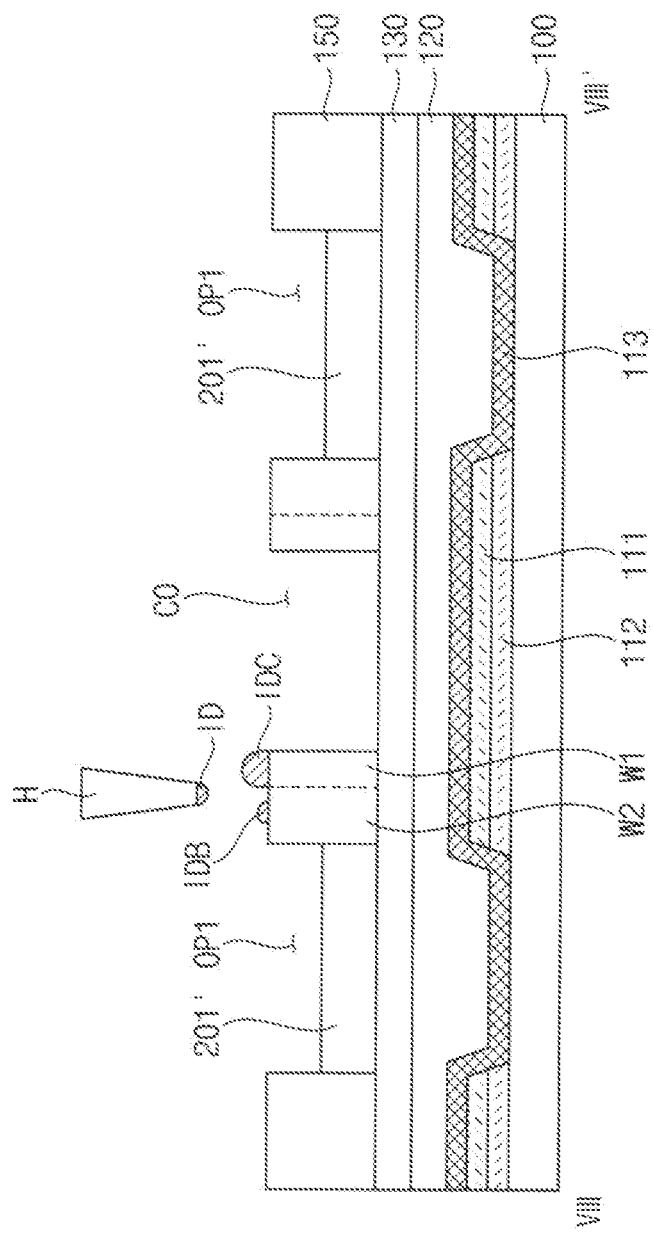
Figure 20:
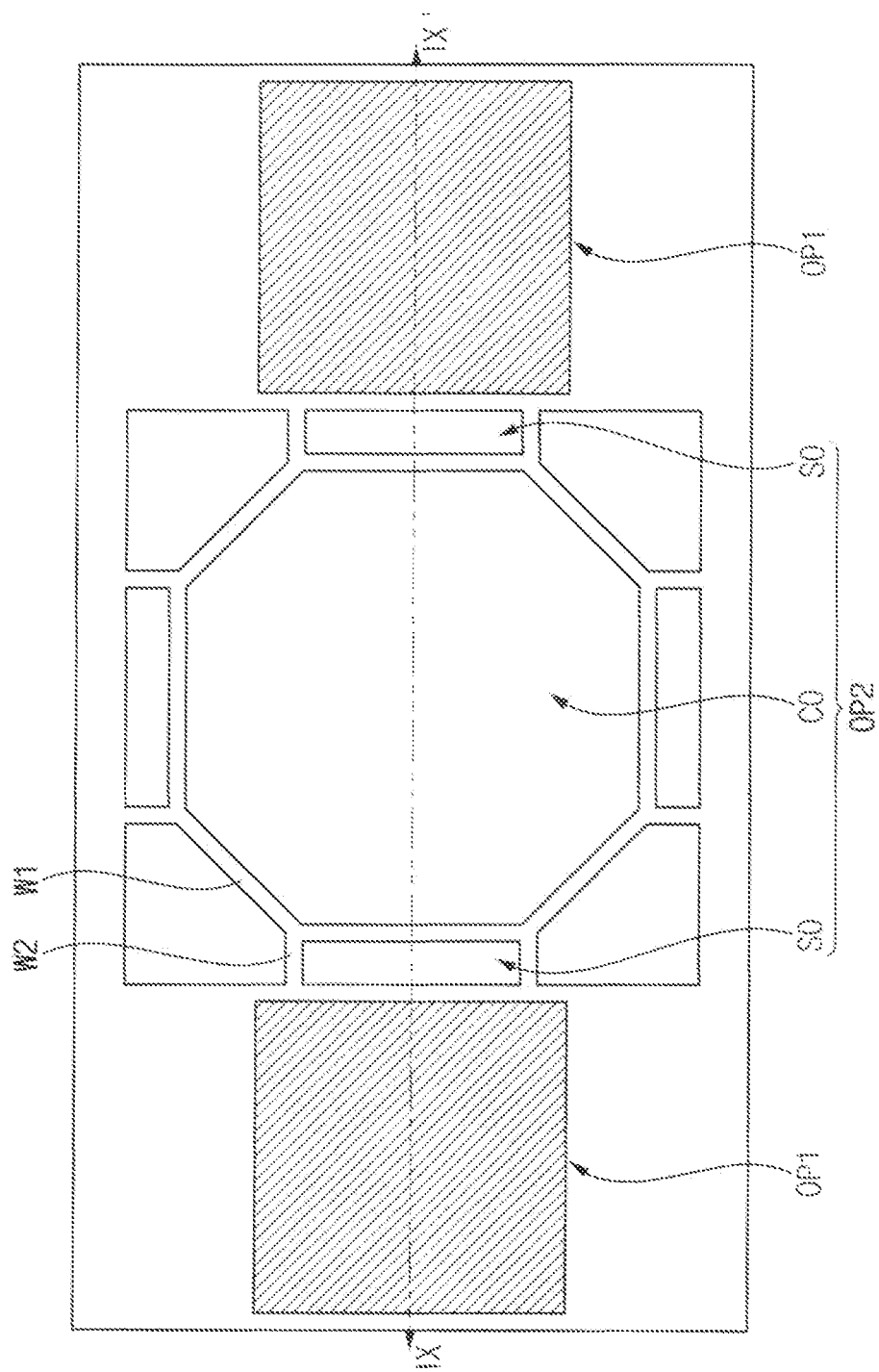
Figure 21:
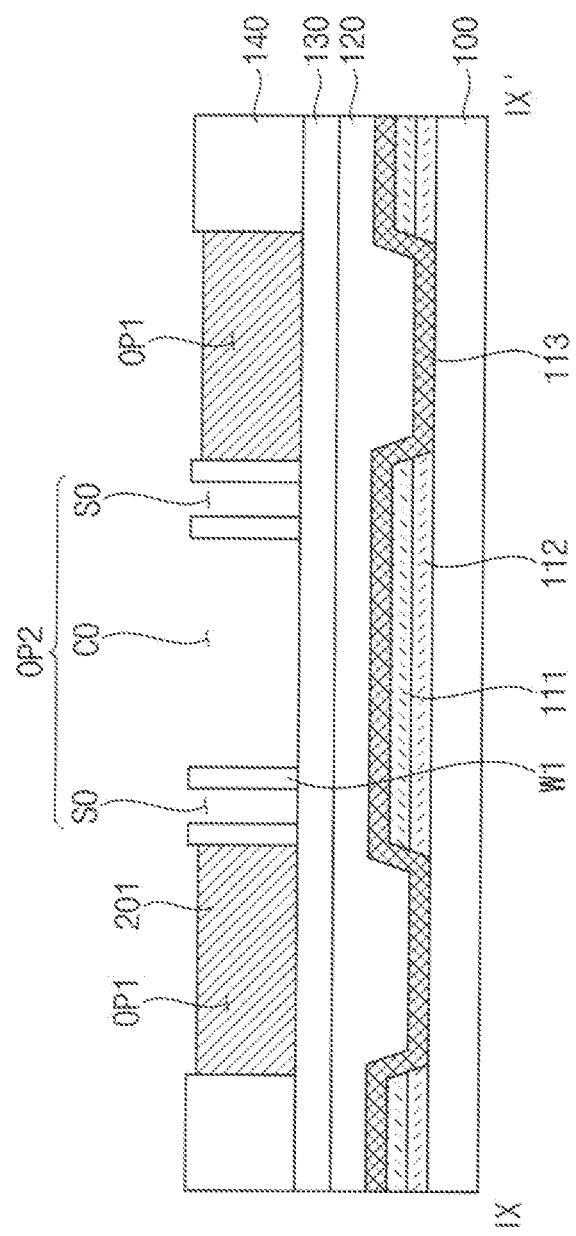

17, FIG. 19 is a sectional view taken along the line VIII-VIII' of FIG. 17, and FIG. 21 is a sectional view taken along the line IX-IX' of FIG. 20.

Referring to FIGS. 13 and 14, a color filter layer 110 may be formed on an upper substrate 100. The color filter layer 110 may include first to third color filter layers 111, 112, and 113. During a process of forming the color filter layer 110, the first to third color filter layers 111, 112, and 113 may be stacked on a partial region of the upper substrate 100 such that the first to third color filter layers 111, 112, and 113 may overlap each other. The partial region may be a light blocking region through which light does not pass. A low refraction layer 120 may be formed on the color filter layer 110. A protective layer 130 may be formed on the low refraction layer 120. A preliminary bank 141 may be formed on the protective layer 130. The upper substrate 100, the color filter layer 110, the low refraction layer 120, and the protective layer 130 may be substantially the same as the upper substrate 100, the color filter layer 110, the low refraction layer 120, and the protective layer 130, respectively, described with reference to FIGS. 2 to 4.

Referring to FIGS. 15 and 16, the preliminary bank 141 may be etched to form a bank 140, a first partition wall W1, and a second partition wall W2.

In this case, a width (e.g., D1 of FIG. 2) of the first partition wall W1 may be relatively small, and a width (e.g., D2 of FIG. 2) of the second partition wall W2 may be relatively small.

In addition, a region (e.g., the region C of FIG. 5) where the first partition wall W1 and the second partition wall W2 make contact with each other may have a relatively small area. For example, each of the width (e.g., D1 of FIG. 2) of the first partition wall W1 and the width (e.g., D2 of FIG. 2) of the second partition wall W2 may be relatively small. As another example, an angle between the first partition wall W1 and the second partition wall W2 may be adjusted, so that the region where the first partition wall W1 and the second partition wall W2 make contact with each other may have a relatively small area.

The bank 140 may include a first opening region OP1 and a second opening region OP2. The second opening region OP2 may include a central region CO and a peripheral region SO. The bank 140, the first partition wall W1, and the second partition wall W2 may be substantially the same as the bank 140, the first partition wall W1, and the second partition wall W2, respectively, described with reference to FIGS. 2 to 4.

Referring to FIGS. 17 to 19, an inkjet head H may drop an ink ID including color conversion particles in the first opening region OP1. The inkjet head H may repeatedly drop the ink ID in the first opening region OP1 to form a first color conversion layer 201.

In addition, the inkjet head H may drop the ink ID in the second opening region OP2. The ink ID that is dropped in the second opening region OP2 may be referred to as an erroneously jetted ink. The erroneously jetted ink may be classified into a first erroneously jetted ink IDA, a second erroneously jetted ink IDB, and a third erroneously jetted ink IDC according to a location where the erroneously jetted ink is dropped.

The first erroneously jetted ink IDA may be an ink that is erroneously jetted in the central region CO or the peripheral region SO. The first erroneously jetted ink IDA may be received in the central region CO or the peripheral region SO, and may not form a protrusion on the bank 140.

The second erroneously jetted ink IDB may be an ink that is erroneously jetted on the first partition wall W1 or the second partition wall W2. The second erroneously jetted ink IDB may form a protrusion on the first partition wall W1 or the second partition wall W2. According to the present disclosure, the width (e.g., D1 of FIG. 2) of the first partition wall W1 may be relatively small, and the width (e.g., D2 of FIG. 2) of the second partition wall W2 may be relatively small. Accordingly, when an ink is erroneously jetted on the first partition wall W1 or the second partition wall W2, a protrusion having a relatively small size may be formed on the first partition wall W1 or the second partition wall W2, or no protrusion may be formed.

The third erroneously jetted ink IDC may be an ink that is erroneously jetted in a region where the first partition wall W1 and the second partition wall W2 make contact with each other. The third erroneously jetted ink IDC may form a protrusion in the region where the first partition wall W1 and the second partition wall W2 make contact with each other. According to the present disclosure, the region (e.g., the region C of FIG. 5) where the first partition wall W1 and the second partition wall W2 make contact with each other may have a relatively small area. Accordingly, when an ink is erroneously jetted in the region where the first partition wall W1 and the second partition wall W2 make contact with each other, a protrusion having a relatively small size may be formed, or no protrusion may be formed.

Referring to FIGS. 20 and 21, the first color conversion layer 201 may be formed in the first opening region OP1. The first color conversion layer 201 may be substantially the same as the first color conversion layer 201 described with reference to FIG. 2.

The color conversion substrate according to one or more embodiments of the present disclosure may be applied to various display devices, electronic devices, portable devices, communication devices, and/or the like. For example, the color conversion substrate according to the one or more embodiments of the present disclosure may be applied to a computer, a mobile phone, a smartphone, a smart pad, a TV, and/or the like.

Although embodiments of the present disclosure have been described above, it will be understood by those skilled in the art that various changes and modifications can be made to the present disclosure without departing from the spirit and scope of the present disclosure as set forth in the appended claims, and equivalents thereof.

What is claimed is:

1. A color conversion substrate comprising:
   a bank having a plurality of first opening regions and a second opening region;
   a color conversion layer in the first opening regions, the color conversion layer comprising color conversion particles;
   a first partition wall partitioning the second opening region into a central region and a peripheral region surrounding the central region, the first partition wall having a polygonal shape with n vertices in a plan view where n is a natural number greater than or equal to 3; and
   n second partition walls extending from the n vertices of the first partition wall to an edge of the second opening region, respectively, to partition the peripheral region into n sub-regions,
   wherein the central region is located between adjacent first opening regions of the plurality of first opening regions and does not overlap the color conversion layer.

2. The color conversion substrate of claim 1, wherein each of the n second partition walls is perpendicular to the edge of the second opening region.

3. The color conversion substrate of claim 1, wherein a first thickness of the first partition wall is different from a second thickness of each of the n second partition walls.

4. The color conversion substrate of claim 1, wherein a first thickness of the first partition wall is 5 µm or more and 25 µm or less, and
wherein a second thickness of each of the n second partition walls is 5 µm or more and 25 µm or less.

5. The color conversion substrate of claim 1, wherein an area of each of the n sub-regions is smaller than an area of the central region.

6. The color conversion substrate of claim 1, wherein an angle between a second partition wall of the n second partition walls and the first partition wall contacting the second partition wall is greater than or equal to 90 degrees.

7. The color conversion substrate of claim 1, further comprising a light blocking layer overlapping the second opening region.

8. The color conversion substrate of claim 1, wherein the first partition wall has an octagonal shape comprising a first side, a second side contacting the first side, a third side contacting the second side, a fourth side contacting the third side, a fifth side contacting the fourth side, a sixth side contacting the fifth side, a seventh side contacting the sixth side, and an eighth side contacting the first side and the seventh side in the plan view, and
wherein the n second partition walls comprise a first compartmental wall contacting the first side and the second side, a second compartmental wall contacting the second side and the third side, a third compartmental wall contacting the third side and the fourth side, a fourth compartmental wall contacting the fourth side and the fifth side, a fifth compartmental wall contacting the fifth side and the sixth side, a sixth compartmental wall contacting the sixth side and the seventh side, a seventh compartmental wall contacting the seventh side and the eighth side, and an eighth compartmental wall contacting the eighth side and the first side.

9. The color conversion substrate of claim 8, wherein the first side and the fifth side extend in a first direction, and
wherein the third side and the seventh side extend in a second direction that is perpendicular to the first direction.

10. The color conversion substrate of claim 8, wherein each of the first compartmental wall and the eighth compartmental wall is perpendicular to the first side,
wherein each of the second compartmental wall and the third compartmental wall is perpendicular to the third side,
wherein each of the fourth compartmental wall and the fifth compartmental wall is perpendicular to the fifth side, and
wherein each of the sixth compartmental wall and the seventh compartmental wall is perpendicular to the seventh side.

11. The color conversion substrate of claim 8, wherein each of the first to eighth compartmental walls has a first length,
wherein each of the first side, the third side, the fifth side, and the seventh side has a second length that is different from the first length, and
wherein each of the second side, the fourth side, the sixth side, and the eighth side has a third length that is different from the first length and the second length.

12. The color conversion substrate of claim 11, wherein the first length is smaller than the second length, and
wherein the first length is smaller than the third length.

13. The color conversion substrate of claim 1, wherein the first partition wall comprises a first side, a second side contacting the first side, a third side contacting the second side, a fourth side contacting the third side, a fifth side contacting the fourth side, and a sixth side contacting the fifth side and the first side, and
wherein the n second partition walls comprise a first compartmental wall contacting the first side and the second side, a second compartmental wall contacting the second side and the third side, a third compartmental wall contacting the third side and the fourth side, a fourth compartmental wall contacting the fourth side and the fifth side, a fifth compartmental wall contacting the fifth side and the sixth side, and a sixth compartmental wall contacting the sixth side and the first side.

14. The color conversion substrate of claim 13, wherein the first side and the fourth side are parallel to each other,
wherein the second side and the fifth side are parallel to each other, and
wherein the third side and the sixth side are parallel to each other.

15. The color conversion substrate of claim 13, wherein each of the first compartmental wall and the sixth compartmental wall is perpendicular to the first side, and
wherein each of the third compartmental wall and the fourth compartmental wall is perpendicular to the fourth side.

16. A display device comprising:
a color conversion substrate comprising:
a bank having a first opening region and a second opening region;
a color conversion layer in the first opening region, the color conversion layer comprising color conversion particles;
a first partition wall partitioning the second opening region into a central region and a peripheral region surrounding the central region, the first partition wall having a polygonal shape with n vertices in a plan view where n is a natural number greater than or equal to 3; and
n second partition walls extending from the n vertices of the first partition wall to an edge of the second opening region, respectively, to partition the peripheral region into n sub-regions; and
an array substrate overlapping the color conversion substrate, the array substrate comprising a plurality of light emitting elements, a light emitting element of the plurality of light emitting elements overlapping the first opening region,
wherein the central region is located in a light blocking area between adjacent light emitting elements of the plurality of light emitting elements.

17. The display device of claim 16, wherein the array substrate comprises:
a first light emitting element row comprising a first light emitting element and a second light emitting element, the first light emitting element and the second light emitting element being alternately arranged in a first direction; and
a second light emitting element row comprising third light emitting elements arranged in the first direction, the second light emitting element row being spaced from the first light emitting element row in a second direction that is perpendicular to the first direction, and
wherein the first light emitting element row and the second light emitting element row are alternately arranged in the second direction.

18. The display device of claim 17, wherein the first opening region comprises:
- a first color conversion region overlapping the first light emitting element;
- a second color conversion region overlapping the second light emitting element; and
- a third color conversion region overlapping a third light emitting element of the third light emitting elements, wherein the color conversion substrate comprises:
- a first color conversion row comprising the first color conversion region and the second color conversion region, the first color conversion region and the second color conversion region being alternately arranged in the first direction; and
- a second color conversion row comprising the third color conversion region and the second opening region, the third color conversion region and the second opening region being alternately arranged in the first direction, and wherein the first color conversion row and the second color conversion row are alternately arranged in the second direction.

19. The display device of claim 18, wherein each of the first color conversion region, the second color conversion region, and the third color conversion region has a rectangular shape having a first area in the plan view, and wherein the second opening region has a rectangular shape having a second area that is larger than the first area in the plan view.

20. The display device of claim 18, wherein the color conversion substrate further comprises:
- a third opening region located between the first color conversion region and the second color conversion region, the first color conversion region and the second color conversion region being adjacent to each other; and
- a fourth opening region located between the third color conversion region and the first color conversion row.

21. The display device of claim 20, wherein a width of the third opening region in the first direction is smaller than a width of the first color conversion region in the first direction.

22. The display device of claim 20, wherein a width of the fourth opening region in the second direction is smaller than a width of the third color conversion region in the second direction.

* * * * *